United States Patent
Park et al.

(10) Patent No.: US 12,183,796 B2
(45) Date of Patent: Dec. 31, 2024

(54) SEMICONDUCTOR DEVICE

(71) Applicant: SAMSUNG ELECTRONICS CO., LTD., Suwon-si (KR)

(72) Inventors: Junbeom Park, Seoul (KR); Sangsu Kim, Yongin-si (KR); Junggil Yang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 776 days.

(21) Appl. No.: 17/189,615

(22) Filed: Mar. 2, 2021

(65) Prior Publication Data

US 2022/0037494 A1 Feb. 3, 2022

(30) Foreign Application Priority Data

Jul. 29, 2020 (KR) .................. 10-2020-0094685

(51) Int. Cl.
*H01L 29/423* (2006.01)
*H01L 29/417* (2006.01)

(52) U.S. Cl.
CPC .. *H01L 29/42392* (2013.01); *H01L 29/41725* (2013.01)

(58) Field of Classification Search
CPC ..... H01L 21/823431; H01L 21/823821; H01L 21/823807; H01L 21/823412; H01L 29/41725; H01L 29/42392; H01L 29/0673; H01L 29/78696; H01L 29/66439; H01L 29/775; H01L 29/66795; H01L 29/785–7851; H01L 27/0886; H01L 27/1211
See application file for complete search history.

(56) References Cited

U.S. PATENT DOCUMENTS

| | | | |
|---|---|---|---|
| 7,402,483 B2 | 7/2008 | Yun et al. | |
| 7,427,788 B2 | 9/2008 | Li et al. | |
| 8,551,833 B2 | 10/2013 | Chang et al. | |
| 10,002,939 B1 | 6/2018 | Cheng et al. | |
| 10,297,508 B2 | 5/2019 | Cheng et al. | |
| 10,431,686 B1 | 10/2019 | Yang et al. | |
| 10,522,636 B2 | 12/2019 | Yeung et al. | |
| 2007/0111405 A1* | 5/2007 | Watanabe | H01L 27/11807 438/142 |
| 2016/0268392 A1* | 9/2016 | Zhu | H01L 29/6681 |
| 2020/0006559 A1* | 1/2020 | Mehandru | H01L 29/6653 |
| 2020/0058763 A1 | 2/2020 | Chang et al. | |
| 2020/0381426 A1* | 12/2020 | Xu | H01L 27/088 |
| 2021/0036121 A1* | 2/2021 | Lim | H01L 29/78696 |
| 2021/0193797 A1* | 6/2021 | Xie | H01L 29/0665 |
| 2021/0305389 A1* | 9/2021 | Liaw | H01L 21/823431 |

* cited by examiner

*Primary Examiner* — Jaehwan Oh
(74) *Attorney, Agent, or Firm* — Fish & Richardson P.C.

(57) ABSTRACT

A semiconductor device includes a first source/drain structure having a first length in a horizontal direction, as viewed in a planar cross-sectional view, the horizontal direction being perpendicular to a vertical direction, a second source/drain structure having a second length in the horizontal direction, as viewed in the planar cross-sectional view, the second length being less than the first length, channels extending between the first source/drain structure and the second source/drain structure, the channels being spaced apart from each other in the vertical direction, at least one sacrificial pattern between adjacent ones of the channels, and a trench penetrating the channels and the at least one sacrificial pattern.

19 Claims, 43 Drawing Sheets

SEMICONDUCTOR DEVICE

CROSS-REFERENCE TO RELATED APPLICATION

Korean Patent Application No. 10-2020-0094685, filed on Jul. 29, 2020, in the Korean Intellectual Property Office, and entitled: "Semiconductor Device," is incorporated by reference herein in its entirety.

BACKGROUND

1. Field

Embodiments relate to a semiconductor device, and more particularly, to a semiconductor device including a plurality of channels.

2. Description of the Related Art

Due to the development of electronic technology, the demand for high integration of integrated circuit devices is increasing, and downscaling of the integrated circuit devices is in progress. As integrated circuit devices are downscaled, a short channel effect of a transistor may occur. A transistor having a gate-all-round structure, in which a gate surrounds a channel to reduce the short channel effect, has been proposed.

SUMMARY

According to an aspect of embodiments, there is provided a semiconductor device, including a first source/drain structure having a first length in a horizontal direction on a cross-section perpendicular to a vertical direction, a second source/drain structure having a second length in the horizontal direction on the cross-section, the second length being less than the first length, a plurality of channels respectively extending between the first source/drain structure and the second source/drain structure and apart from each other in the vertical direction, a sacrificial pattern in one of spaces between the plurality of channels, and a trench penetrating the plurality of channels and the sacrificial pattern.

According to another aspect of embodiments, there is provided a semiconductor device, including a first source/drain structure, a second source/drain structure, a plurality of first channels respectively extending from the first source/drain structure and apart from each other in a vertical direction, a plurality of second channels respectively extending from the second source/drain structure and apart from each other in the vertical direction, a plurality of third channels respectively extending between the first source/drain structure and the second source/drain structure and apart from each other in the vertical direction, a first gate structure surrounding the plurality of first channels and extending in a horizontal direction, a second gate structure surrounding the plurality of second channels and extending in the horizontal direction, a sacrificial pattern in one of spaces between the plurality of third channels, and a trench penetrating the sacrificial pattern and the plurality of third channels and extending in the horizontal direction.

According to another aspect of embodiments, there is provided a semiconductor device, including a first transistor including a plurality of first channels apart from each other in a vertical direction, a first gate structure surrounding the plurality of first channels and extending in a horizontal direction, and a pair of first source/drain structures respectively on both sides of the plurality of first channels, a second transistor including a plurality of second channels apart from each other in the vertical direction, a second gate structure surrounding the plurality of second channels and extending in the horizontal direction, and a pair of second source/drain structures respectively on both sides of the plurality of second channels, and a boundary structure between the first transistor and the second transistor, wherein the boundary structure includes a plurality of third channels apart from each other in the vertical direction and a plurality of sacrificial patterns respectively between the plurality of third channels.

BRIEF DESCRIPTION OF THE DRAWINGS

Features will become apparent to those of skill in the art by describing in detail exemplary embodiments with reference to the attached drawings, in which:

FIGS. 2A to 13A are plan views of stages in a method of manufacturing a semiconductor device, according to an embodiment;

FIGS. 2B to 13B are cross-sectional views along line A-A' of FIGS. 2A to 13A, respectively;

FIGS. 3C to 13C are cross-sectional views along line C-C' of FIGS. 3B to 13B, respectively.

DETAILED DESCRIPTION

Figure 1A:
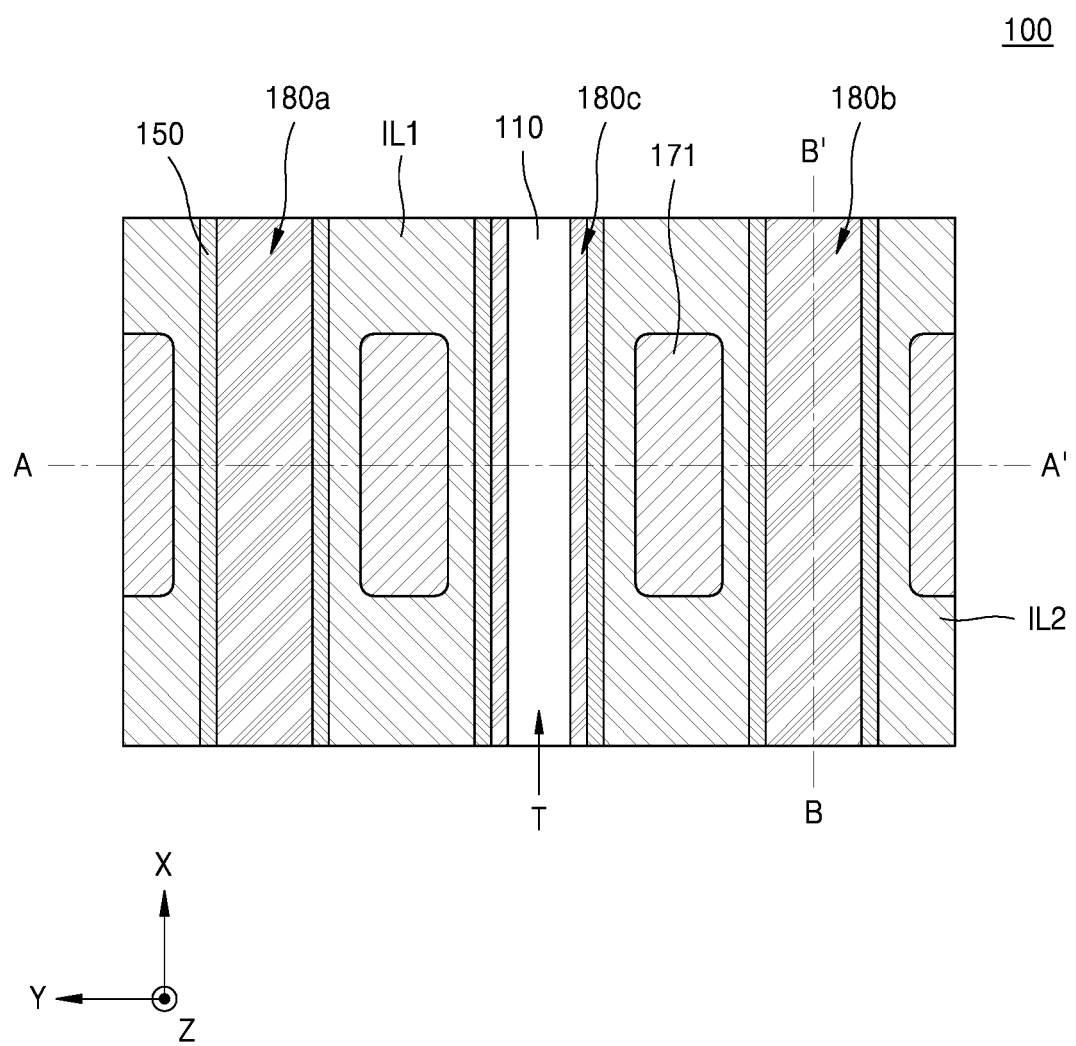
FIG. 1A is a plan view of a semiconductor device according to an embodiment.
Figure 1B:
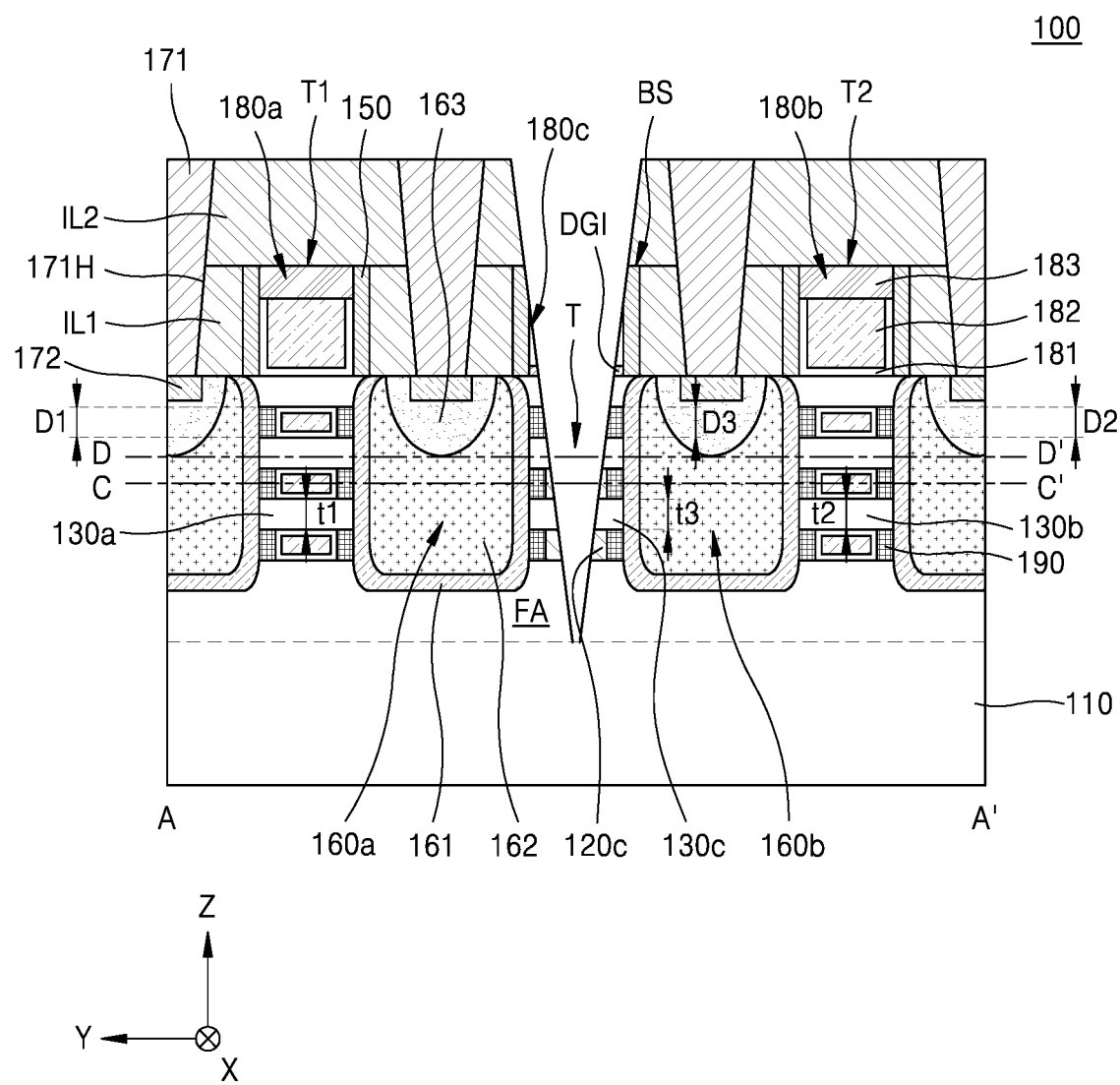
FIG. 1B is a cross-sectional view taken along line A-A' of FIG. 1A.
Figure 1C:
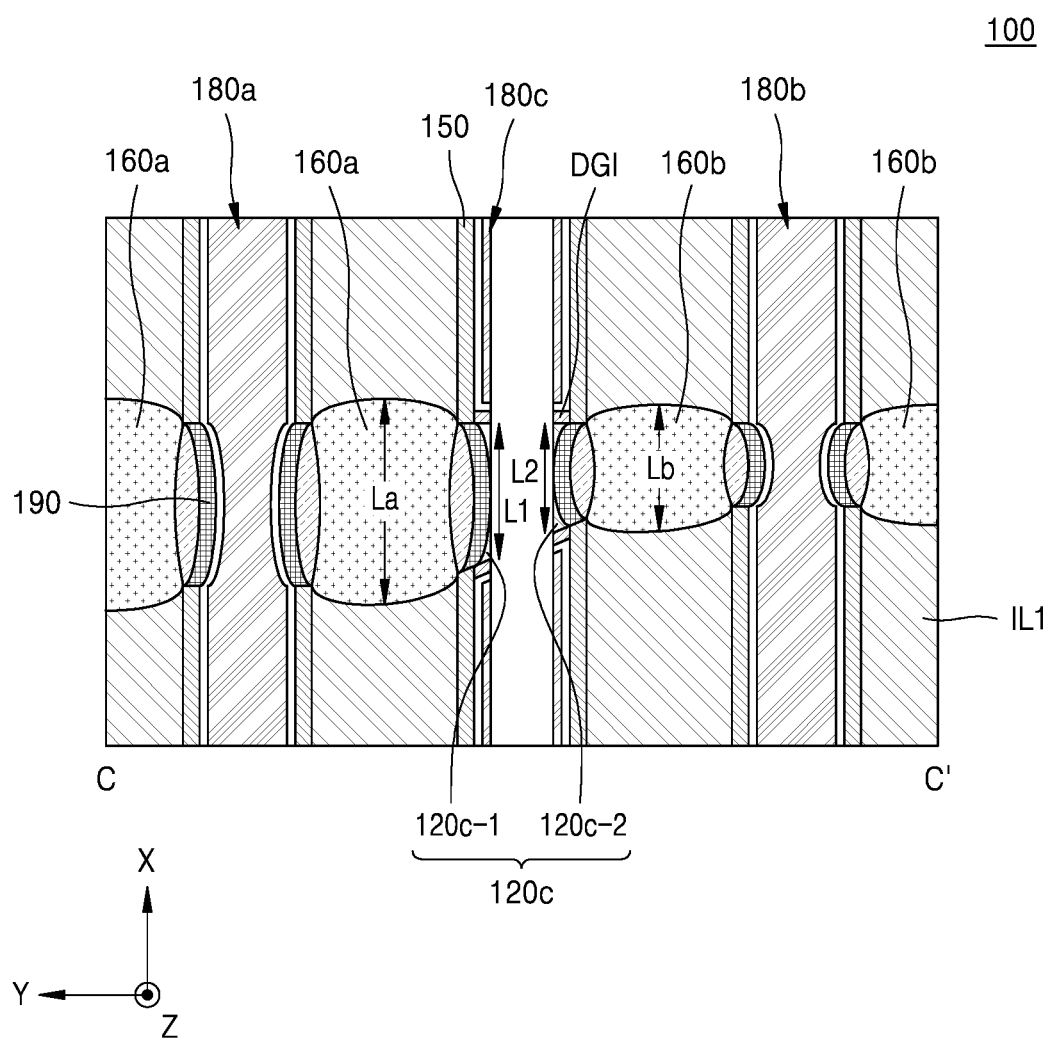
FIG. 1C is a cross-sectional view taken along line C-C' of FIG. 1B.
Figure 1D:
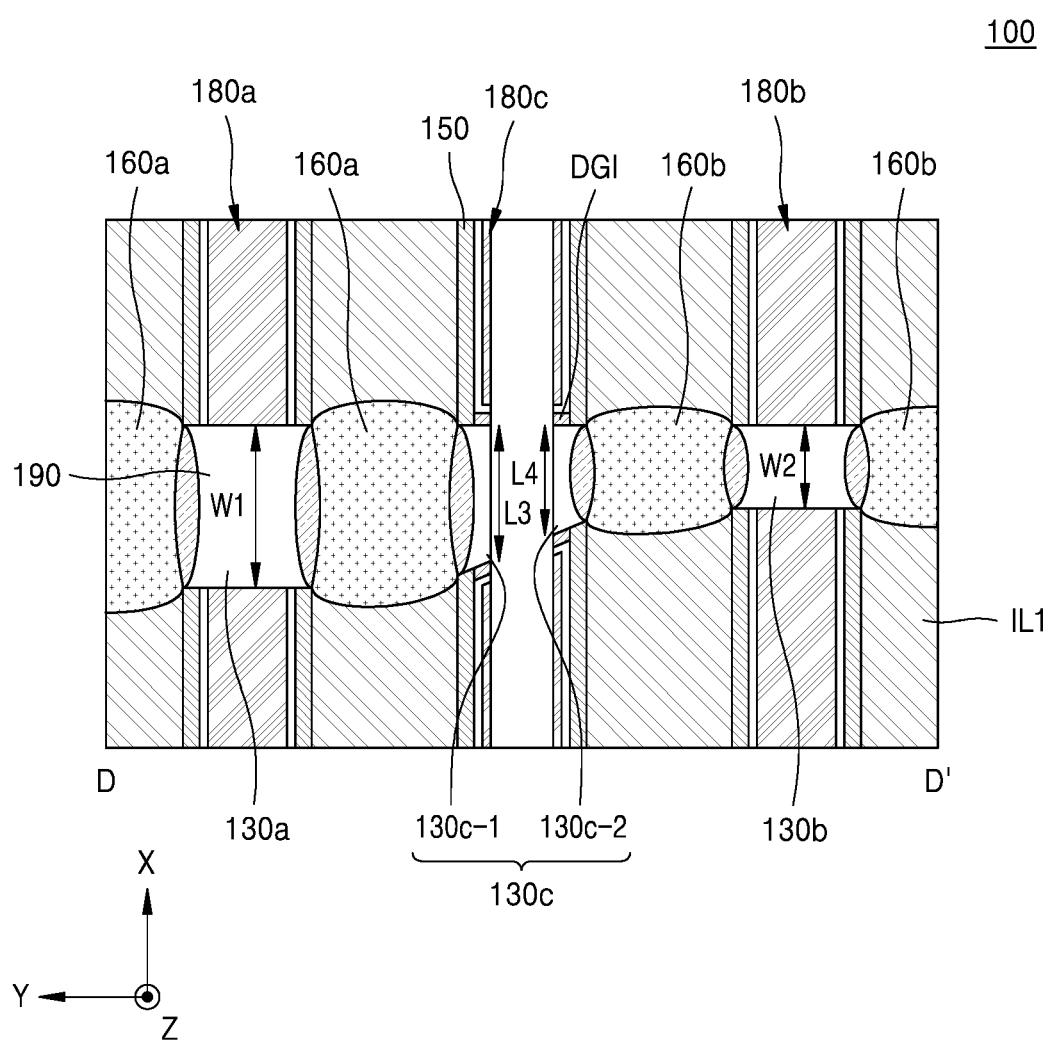
FIG. 1D is a cross-sectional view taken along line D-D' of FIG. 1B.
Figure 1E:
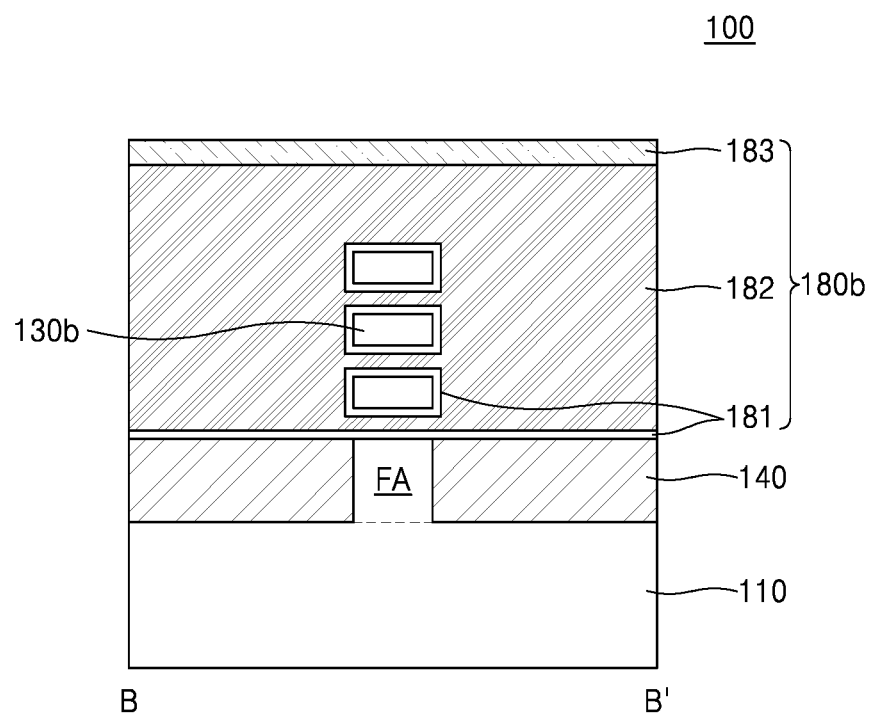
FIG. 1E is a cross-sectional view taken along line B-B' of FIG. 1A.

FIG. 1A is a plan view of a semiconductor device 100 according to an embodiment. FIG. 1B is a cross-sectional view of the semiconductor device 100 taken along line A-A' of FIG. 1A. FIG. 1C is a cross-sectional view of the semiconductor device 100 taken along line C-C' of FIG. 1B. FIG. 1D is a cross-sectional view of the semiconductor device 100 taken along line D-D' of FIG. 1B. FIG. 1E is a cross-sectional view of the semiconductor device 100 taken along line B-B' of FIG. 1A. It is noted that FIGS. 1C and 1D are planar cross-sectional views, as viewed from a top view when taken along the noted lines.

Referring to FIGS. 1A to 1E, the semiconductor device 100 may include a first transistor T1, a second transistor T2, and a boundary structure BS between the first transistor T1 and the second transistor T2. The first transistor T1, the second transistor T2, and the boundary structure BS may be in a fin-type active area FA of a substrate 110. The fin-type active area FA may be defined by a device isolation layer 140.

The substrate 110 may include a semiconductor material, e.g., a Group IV semiconductor material, a Group III-V semiconductor material, or a Group II-VI semiconductor material. The Group IV semiconductor material may include, e.g., silicon (Si), germanium (Ge), or silicon-germanium (SiGe). The Group III-V semiconductor material may include, e.g., gallium arsenide (GaAs), indium phosphide (InP), gallium phosphide (GaP), indium arsenide (InAs), indium antimonide (InSb), or indium gallium arsenide (InGaAs). The Group II-VI semiconductor material may include, e.g., zinc telluride (ZnTe) or cadmium sulfide (CdS). The substrate 110 may be a bulk wafer or an epitaxial layer. The device isolation layer 140 may include, e.g., silicon oxide, silicon nitride, or a combination thereof.

The first transistor T1 may include a plurality of first channels 130a, a first gate structure 180a, and a pair of first source/drain structures 160a. The plurality of first channels 130a may be spaced apart from each other in a vertical direction, e.g., in the Z-direction, extend between the pair of first source/drain structures 160a. The first gate structure 180a may surround the plurality of first channels 130a and extend in a first horizontal direction, e.g., in the X-direction. The first gate structure 180a may include a gate insulating layer 181 conformally surrounding, e.g., each of, the plurality of first channels 130a, a gate electrode layer 182 on the gate insulating layer 181, and a gate capping layer 183 on an upper surface of the gate electrode layer 182.

The first transistor T1 may further include two spacers 150 respectively on both side surfaces of the first gate structure 180a. In some embodiments, the gate insulating layer 181 may further extend between each of the two spacers 150 and the gate electrode layer 182.

The pair of first source/drain structures 160a may be on both, e.g., opposite, sides of the plurality of first channels 130a. In some embodiments, each of the pair of first source/drain structures 160a may include a plurality of source/drain layers, e.g., first to third source/drain layers 161 to 163. Although FIG. 1B illustrates that each of the pair of first source/drain structures 160a includes three source/drain layers, i.e., the first to third source/drain layers 161 to 163, the number of source/drain layers in each of the pair of source/drain structures 160a may be less than or greater than three.

The second transistor T2 may include a plurality of second channels 130b, a second gate structure 180b, and a pair of second source/drain structures 160b. The plurality of second channels 130b may be spaced apart from each other in the vertical direction, e.g., in the Z-direction, and extend between the pair of second source/drain structures 160b. The second gate structure 180b may surround the plurality of second channels 130b and extend in the first horizontal direction, e.g., in the X-direction. The second gate structure 180b may include the gate insulating layer 181 conformally surrounding the plurality of second channels 130b, the gate electrode layer 182 on the gate insulating layer 181, and the gate capping layer 183 on the upper surface of the gate electrode layer 182.

The second transistor T2 may further include two spacers 150 respectively on both, e.g., opposite, side surfaces of the second gate structure 180b. In some embodiments, the gate insulating layer 181 may further extend between each of the two spacers 150 and the gate electrode layer 182.

The pair of second source/drain structures 160b may be on both sides of the plurality of second channels 130b. In some embodiments, one of the pair of second source/drain structures 160b may include a plurality of source/drain layers, e.g., the first to third source/drain layers 161 to 163. Although FIG. 1B illustrates that each of the pair of second source/drain structures 160b includes three source/drain layers, i.e., the first to third source/drain layers 161 to 163, the number of source/drain layers in each of the pair of second source/drain structures 160b may be less than or greater than three.

Each of the plurality of first channels 130a and each of the plurality of second channels 130b may include silicon (Si).

The gate insulating layer 181 may include an interface layer and a high-dielectric permittivity layer. The interface layer may include a low dielectric material having a dielectric permittivity of about 9 or less, e.g., silicon oxide, silicon oxynitride, gallium oxide, germanium oxide, or a combination thereof. The high-dielectric permittivity layer may include a high dielectric constant material having a higher dielectric constant than that of silicon oxide. For example, the high dielectric constant material may have a dielectric constant of about 10 or more. For example, the high dielectric material may include hafnium oxide, hafnium oxynitride, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The gate electrode layer 182 may include a work function layer and a buried layer. The work function layer may include, e.g., aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum carbide (TiAlC), titanium aluminum nitride (TiAlN), tantalum carbon nitride (TaCN), tantalum carbide (TaC), tantalum silicon nitride (TaSiN), or a combination thereof. The buried layer may include, e.g., Al, Cu, Ti, Ta, W, Mo, TaN, NiSi, CoSi, TiN, WN, TiAl, TiAlC, TiAlN, TaCN, TaC, TaSiN, or a combination thereof.

The gate capping layer 183 may include, e.g., silicon nitride. Each of the two spacers 150 may include, e.g., silicon oxide, silicon nitride, or a combination thereof. The first to third source/drain layers 161 to 163 may include, e.g., Si, SiGe, Ge, or a combination thereof.

The first transistor T1 may further include a plurality of internal spacers 190 respectively between the plurality of first channels 130a and extending between the first source/drain structure 160a and the first gate structure 180a. Similarly, the second transistor T2 may further include the plurality of internal spacers 190 respectively between the plurality of second channels 130b and extending between the second source/drain structure 160b and the second gate structure 180b. Each of the plurality of internal spacers 190 may include, e.g., silicon oxide, silicon-germanium-oxide, silicon-germanium-nitride, or a combination thereof.

The boundary structure BS may include a plurality of third channels 130c and a plurality of sacrificial patterns 120c. The plurality of third channels 130c may be spaced apart from each other in the vertical direction, e.g., in the Z-direction, and extend between the first source/drain structure 160a and the second source/drain structure 160b. Each of the plurality of third channels 130c may include Si. The number of third channels 130c may be the same as the number of first channels 130a and as the number of second channels 130b. Although the number of third channels 130c, the number of first channels 130a, and the number of second channels 130b are illustrated as three in FIG. 1B, the number of third channels 130c, the number of first channels 130a, and the number of second channels 130b may be greater than or less than three. The plurality of sacrificial patterns 120c may be respectively between the plurality of third channels 130c. That is, the plurality of sacrificial patterns 120c and the plurality of third channels 130c may be alternately stacked. Each of the plurality of sacrificial patterns 120c may include SiGe.

In some embodiments, the boundary structure BS may include a trench T penetrating the plurality of third channels 130c and the plurality of sacrificial patterns 120c. The trench T may extend in the first horizontal direction, e.g., in the X-direction (into the page of FIG. 1B). In some embodiments, at least one of the plurality of sacrificial patterns 120c may be completely removed when forming the trench T. However, at least one of the plurality of sacrificial patterns 120c may partially remain. For example, at least one of the plurality of sacrificial patterns 120c may be completely removed when forming the trench T, while the remaining plurality of sacrificial patterns 120c may partially remain. In this case, the trench T may penetrate the remaining plurality of sacrificial patterns 120c. In another example, none of the plurality of sacrificial patterns 120c may be completely removed when forming the trench T, so all of the plurality of sacrificial patterns 120c may partially remain. In this case, the trench T may penetrate all of the plurality of sacrificial patterns 120c.

The boundary structure BS may further include a third gate structure 180c in contact with an uppermost one of the plurality of third channels 130c and extending in the first horizontal direction, e.g., in the X-direction. Similar to the first gate structure 180a and the second gate structure 180b, the third gate structure 180c may include the gate insulating layer 181, the gate electrode layer 182, and the gate capping layer 183. The third gate structure 180c may not surround the plurality of third channels 130c. That is, the third gate structure 180c may not fill spaces between the plurality of third channels 130c. Instead, the plurality of sacrificial patterns 120c may fill the spaces between the plurality of third channels 130c.

In some embodiments, the third gate structure 180c may further include a dummy gate insulating layer DGI below the gate insulating layer 181. The dummy gate insulating layer DGI may include, e.g., silicon oxide, silicon nitride, or a combination thereof. In some embodiments, the boundary structure BS may further include two spacers 150 respectively on both sides of the third gate structure 180c.

The trench T may further penetrate the third gate structure 180c. In some embodiments, the third gate structure 180c may be completely removed during formation of the trench T. In another embodiment, the third gate structure 180c may be partially removed during formation of the trench T, so a portion of the third gate structure 180c may remain. The trench T may extend in the first horizontal direction, e.g., in the X-direction, along the third gate structure 180c.

In some embodiments, the boundary structure BS may further include the plurality of internal spacers 190 respectively between the plurality of third channels 130c and extending between the plurality of sacrificial patterns 120c and the first source/drain structure 160a, and between the plurality of sacrificial patterns 120c and the second source/drain structure 160b. For example, during formation of the trench T, at least one of the plurality of internal spacers 190 may remain. In another example, during formation of the trench T, all of the plurality of internal spacers 190 may partially remain.

In the cross-section of FIG. 1B, a distance D3 between adjacent ones of the plurality of third channels 130c in the vertical direction (the Z-direction) may be the same as a distance D1 between adjacent ones of the plurality of first channels 130a in the vertical direction (the Z-direction), and the same as a distance D2 between adjacent ones of the plurality of second channels 130b in the vertical direction (the Z-direction). In addition, in the cross-section of FIG. 1B, a thickness t3 of each of the plurality of third channels 130c in the vertical direction (the Z-direction) may be the same as a thickness t1 of each of the plurality of first channels 130a in the vertical direction (the Z-direction), and the same as a thickness t2 of each of the plurality of second channels 130b in the vertical direction (the Z-direction).

In some embodiments, a volume of the first source/drain structure 160a may be greater than a volume of the second source/drain structure 160b. For example, as illustrated in the cross-section of FIG. 1C, a length La of the first source/drain structure 160a in the first horizontal direction (the X-direction) may be greater than a length Lb of the second source/drain structure 160b in the first horizontal direction (the X-direction). In the cross-section of FIG. 1C, each of the plurality of sacrificial patterns 120c may include a first portion 120c-1 in contact with the first source/drain structure 160a and having a first length L1 in the first horizontal direction (the X-direction), and a second portion 120c-2 in contact with the second source/drain structure 160b and having a second length L2 in the first horizontal direction (the X-direction). The first length L1 may be greater than the second length L2.

In the cross-section of FIG. 1D, a width W1 of each of the plurality of first channels 130a in the first horizontal direction (the X-direction) may be greater than a width W2 of each of the plurality of second channels 130b in the first horizontal direction (the X-direction). Each of the plurality of third channels 130c may include a first portion 130c-1 in contact with the first source/drain structure 160a and having a third length L3 in the first horizontal direction (the X-direction), and a second portion 130c-2 in contact with the second source/drain structure 160b and having a fourth length L4 in the first horizontal direction (the X-direction). The third length L3 may be greater than the fourth length L4.

A first interlayer insulating layer IL1 covering the first transistor T1, the second transistor T2, and the boundary structure BS may be further arranged. The first interlayer insulating layer IL1 may cover the pairs of the first source/drain structures 160a and the pairs of second source/drain structures 160b and expose upper surfaces of the first gate structure 180a, the second gate structure 180b, and the third gate structure 180c. An upper surface of the first interlayer insulating layer IL1 may be on the same plane as the upper surfaces of the first gate structure 180a, the second gate structure 180b, and the third gate structure 180c. A second interlayer insulating layer IL2 may be further arranged on the first interlayer insulating layer IL1, the first gate structure 180a, the second gate structure 180b, and the third gate structure 180c. The first interlayer insulating layer IL1 and the second interlayer insulating layer IL2 may include silicon oxide or a low dielectric material. The low dielectric material may include, e.g., undoped silicate glass (USG), phosphosilicate glass (PSG), borosilicate glass (BSG), fluoride silicate glass (FSG), spin on glass (SOG), or Tonen Silazene (TOSZ).

A plurality of contacts 171 penetrating the first interlayer insulating layer IL1 and the second interlayer insulating layer IL2 and respectively in contact with the pairs of first source/drain structures 160a and the pairs of second source/drain structures 160b may be further arranged. In some embodiments, the semiconductor device 100 may further include a plurality of silicide layers 172 between one of the plurality of contacts 171 and the first source/drain structure 160a and between one of the plurality of contacts 171 and the second source/drain structure 160b, e.g., each of the plurality of silicide layers 172 may be between one of the plurality of contacts 171 and a corresponding one of the first and second source/drain structures 160a and 160b. The one of the plurality of contacts 171 may include, e.g., tungsten, titanium, tantalum, or a combination thereof. One of the plurality of silicide layers 172 may include, e.g., titanium silicide, tantalum silicide, or a combination thereof.

According to embodiments, at least one of the plurality of sacrificial patterns 120c of the boundary structure BS may remain in a final device structure. Therefore, etching of the first source/drain structure 160a, which could potentially occur if all of the plurality of sacrificial patterns 120c of the boundary structure BS were to be removed, may be prevented by not removing all of the plurality of sacrificial patterns 120c. Accordingly, a decrease in the manufacturing yield of a semiconductor device due to undesired etching of the first source/drain structure 160a may be prevented. Therefore, the semiconductor device 100 may achieve an improved manufacturing yield.

FIGS. 2A to 13A are plan views illustrating stages in a method of manufacturing a semiconductor device, according to an embodiment. FIGS. 2B to 13B are cross-sectional views respectively taken along line A-A' of FIGS. 2A to 13A, FIGS. 3C to 13C are cross-sectional views respectively taken along line C-C' of FIGS. 3B to 13B, and FIGS. 3D, 4D, and 13D are cross-sectional views respectively taken along line B-B' of FIGS. 3A, 4A, and 13A.

Figure 2A:
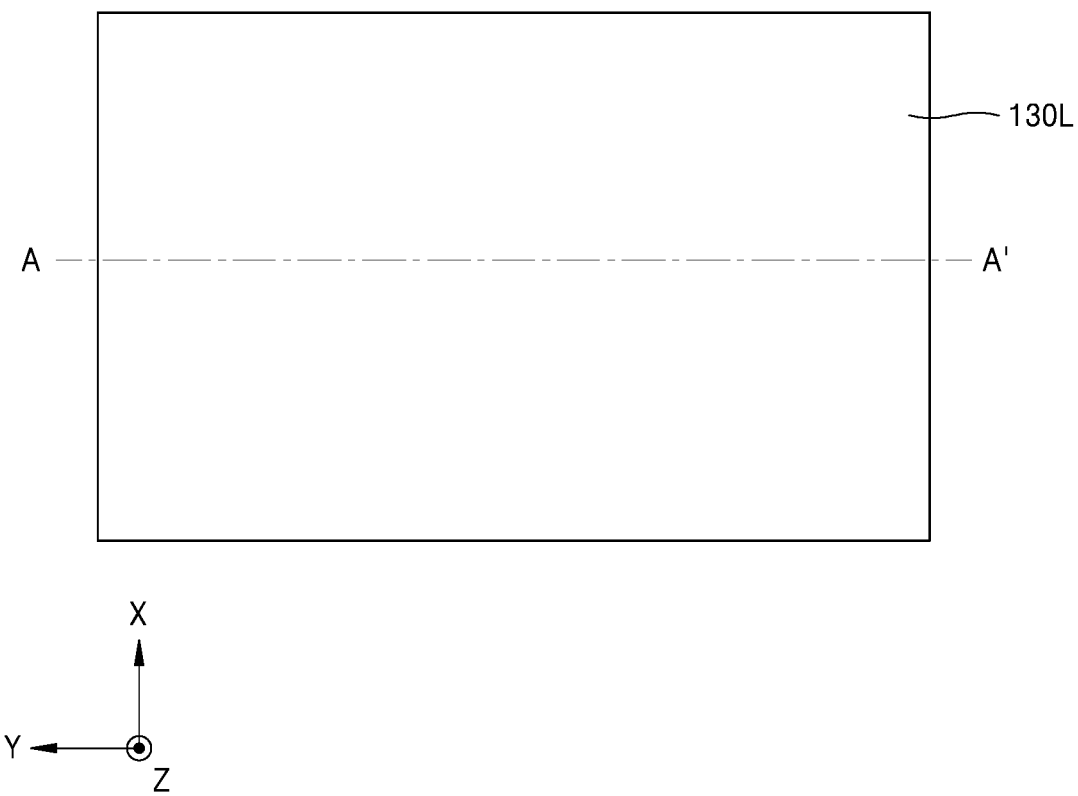
Figure 2B:
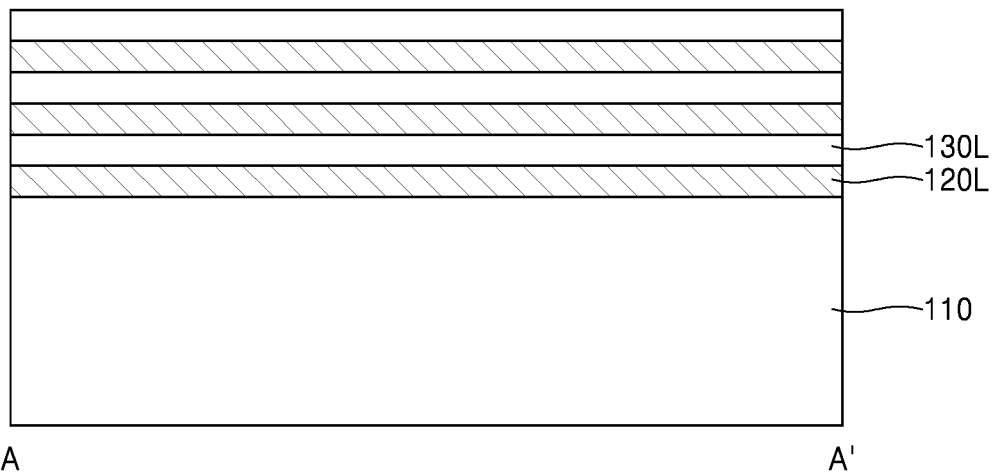
Figure 3A:
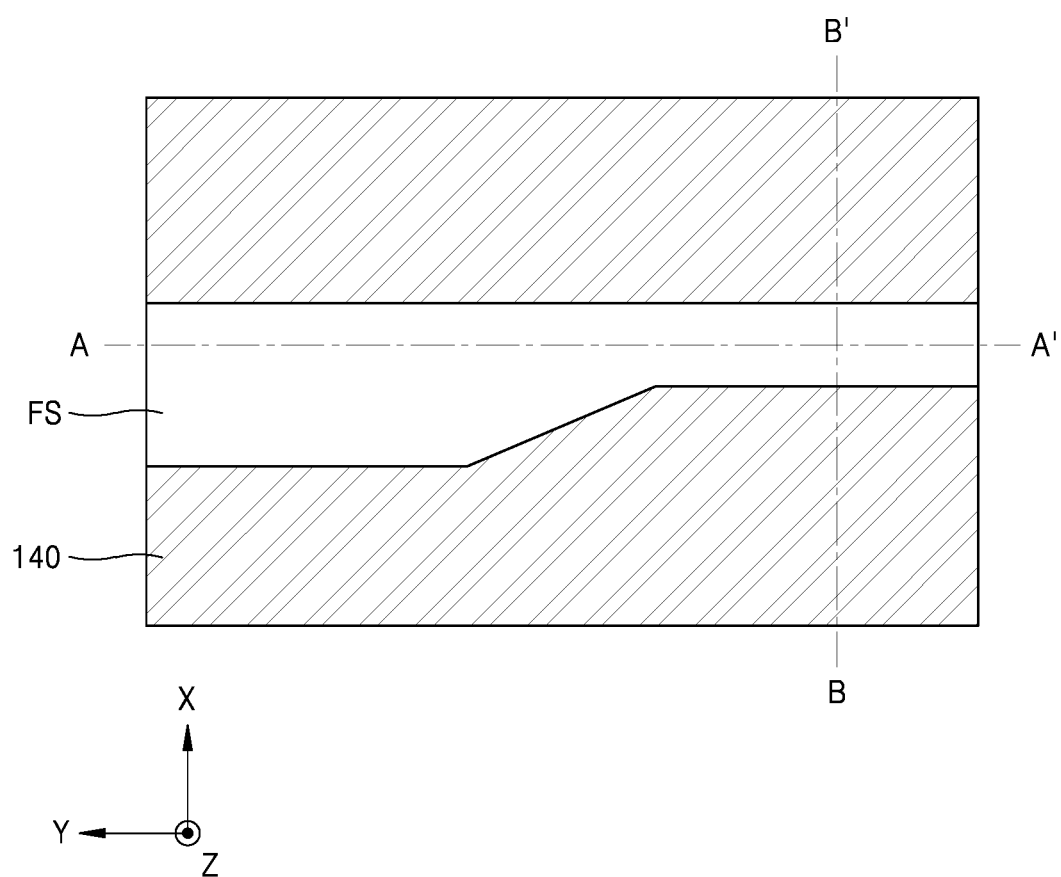
Figure 3B:
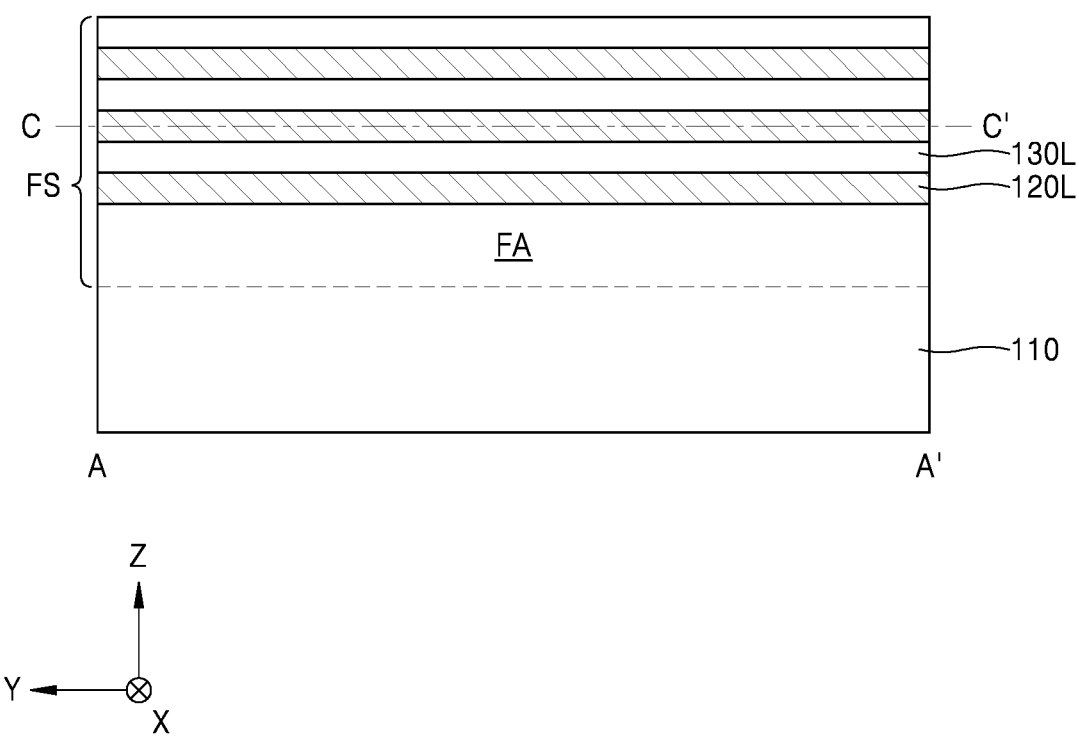

Referring to FIGS. 2A and 2B, a plurality of sacrificial layers 120L and a plurality of channel layers 130L may be alternately formed on the substrate 110. The plurality of sacrificial layers 120L and the plurality of channel layers 130L may be formed by an epitaxial operation. The plurality of sacrificial layers 120L may include a material having an etch selectivity with respect to the plurality of channel layers 130L. For example, the plurality of channel layers 130L may include Si, and the plurality of sacrificial layers 120L may include SiGe.

Referring to FIGS. 3A to 3D, a device isolation trench 140T may be formed by forming a mask on an uppermost one of the plurality of channel layers 130L, etching the plurality of sacrificial layers 120L, the plurality of channel layers 130L, and the substrate 110 by using the mask as an etching mask, and removing the mask. The device isolation trench 140T may define a fin structure FS including a fin-type active area FA of the substrate 110.

Figure 3C:
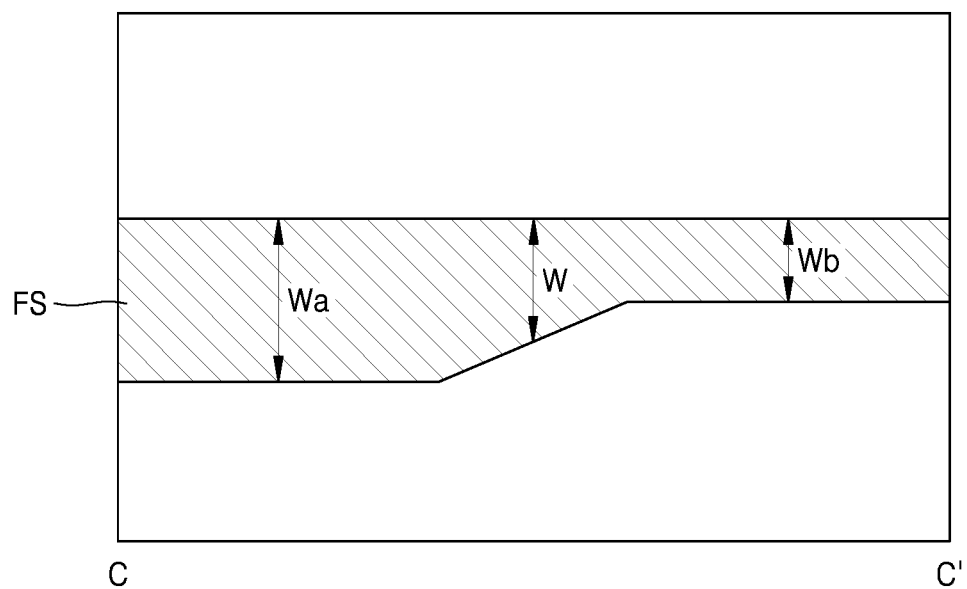
Figure 3D:
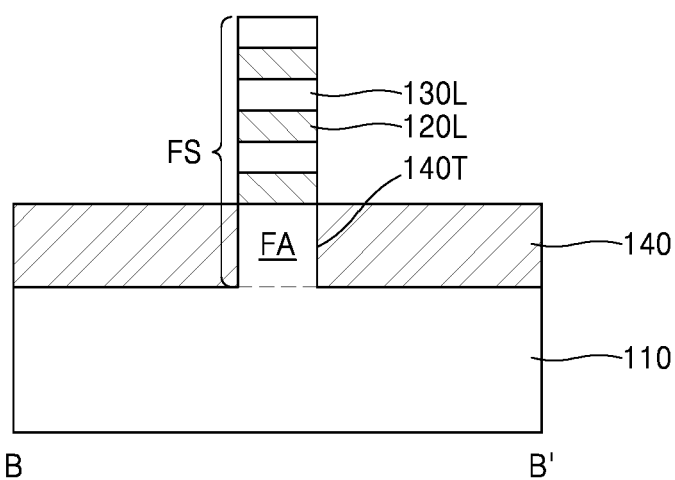
FIGS. 3D, 4D, and 13D are cross-sectional views taken along line B-B' of FIGS. 3A, 4A, and 13A.
Figure 4A:
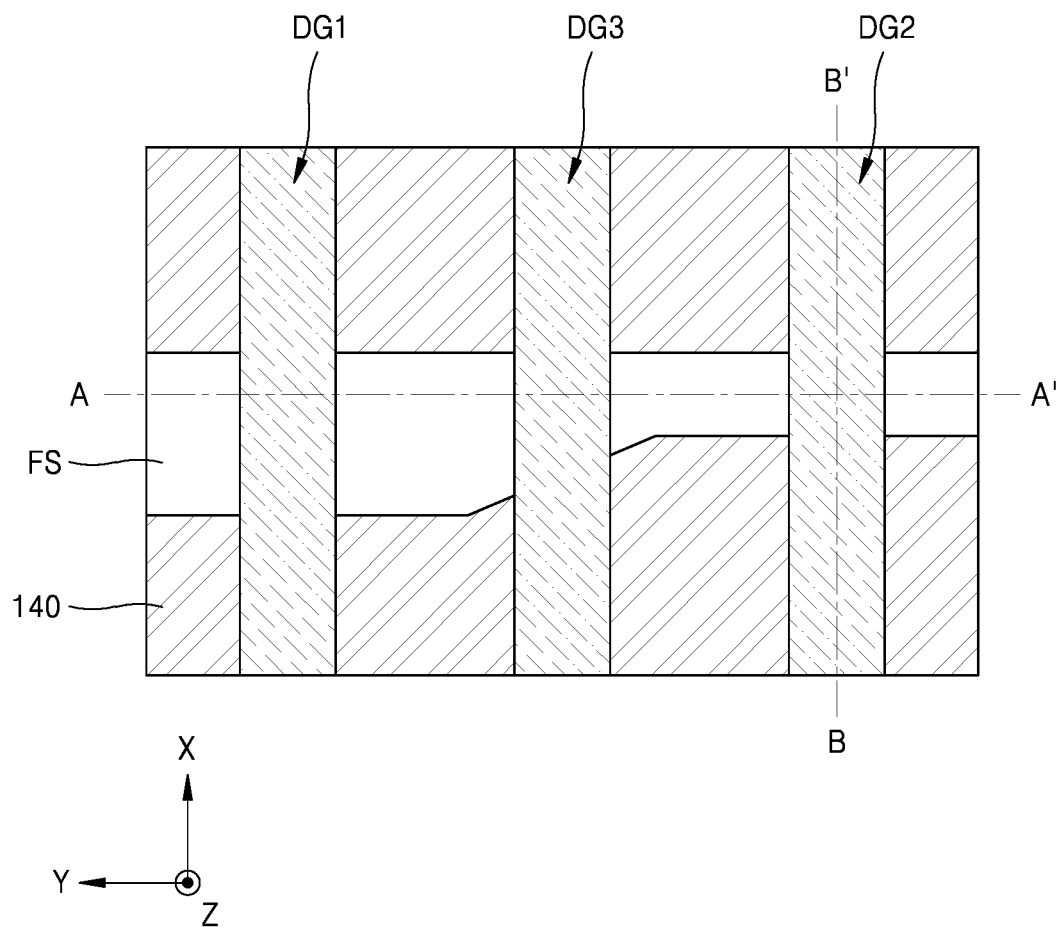
Figure 4B:
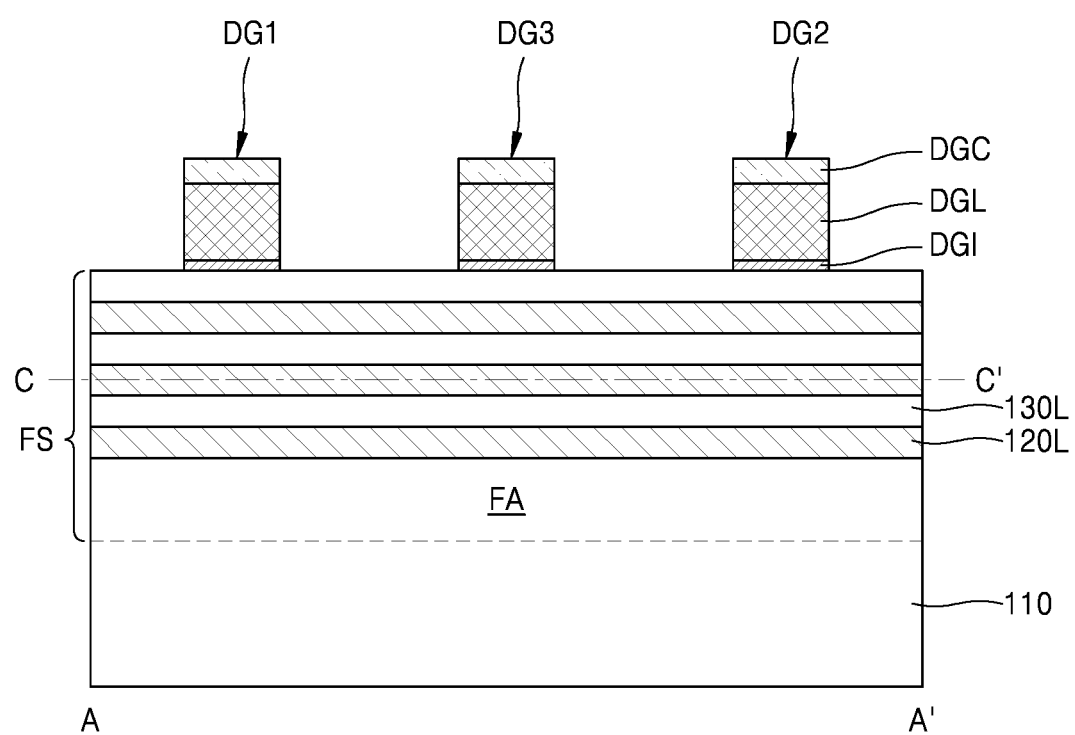
Figure 4C:
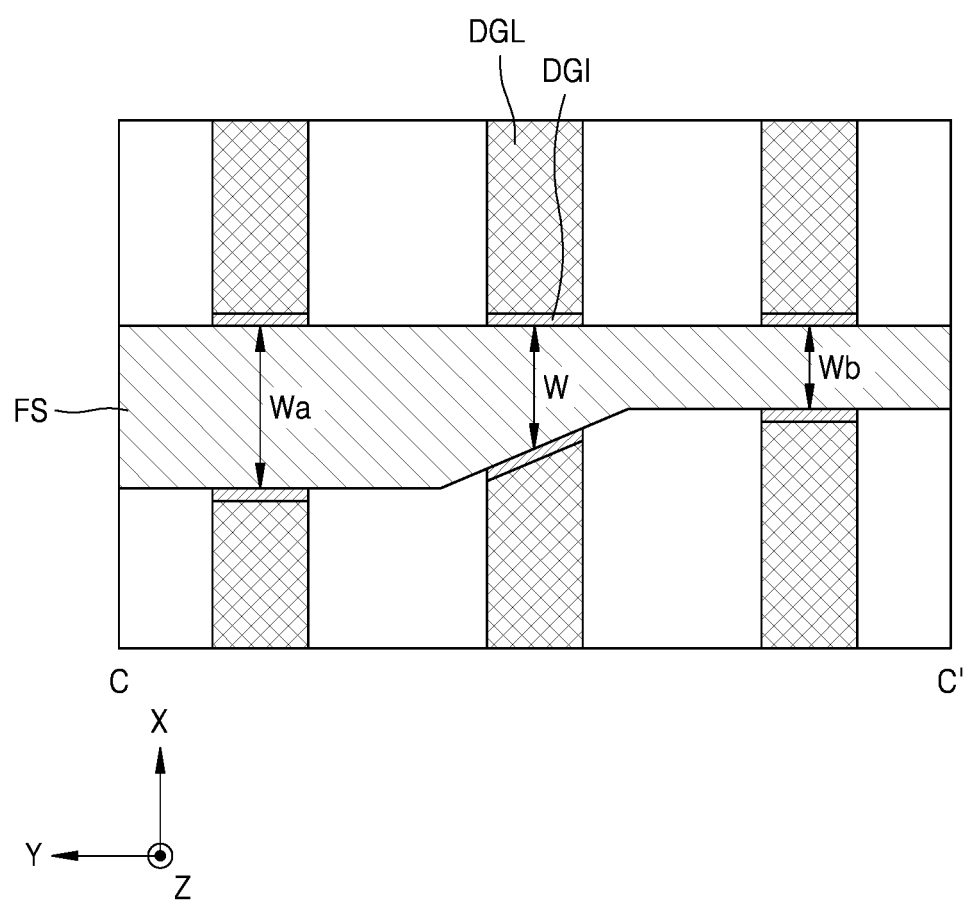
Figure 4D:
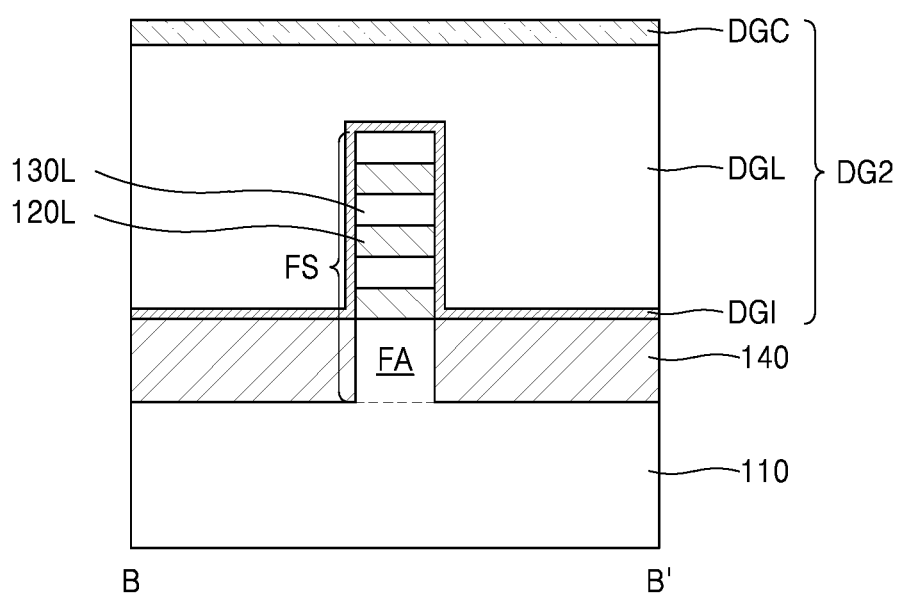

For example, as illustrated in FIG. 3C, the fin structure FS may extend in a second horizontal direction, e.g., in the Y-direction, and have a varying width, e.g., in the X-direction. In the cross-section of FIG. 3C, the fin structure FS may include a first portion having a first width Wa, a second portion having a second width Wb, and a third portion between the first portion and the second portion and having a third width W between the first width Wa and the second width Wb, wherein the third width W is tapered. For example, as illustrated in FIG. 3C, the first and second widths Wa and Wb may be constant, e.g., the first width Wa may be larger than the second width Wb, and the third width W may be variable to have a, e.g., gradually, decreasing value from the first width Wa to the second width Wb to have the tapered shape.

Next, a device isolation layer 140 may be formed to fill the device isolation trench 140T. An upper portion of the device isolation layer 140 may be removed such that an upper surface of the device isolation layer 140 may be equal to or lower than an upper surface of the substrate 110, i.e., an upper surface of the fin-type active area FA.

Referring to FIGS. 4A to 4D, a first dummy gate structure DG1 may be formed on the first portion of the fin structure FS to extend in the first horizontal direction (the X-direction). That is, the first dummy gate structure DG1 may cross, e.g., overlap, the first portion of the fin structure FS that has the first width Wa. In addition, a second dummy gate structure DG2 may be formed on the second portion of the fin structure FS to extend in the first horizontal direction (the X-direction). That is, the second dummy gate structure DG2 may cross, e.g., overlap, the second portion of the fin structure FS that has the second width Wb. In addition, a third dummy gate structure DG3 may be formed on the third portion of the fin structure FS to extend in the first horizontal direction (the X-direction), e.g., the third dummy gate structure DG3 may be between the first and second dummy gate structures DG1 and DG2. That is, the third dummy gate structure DG3 may cross, e.g., overlap, the third portion of the fin structure FS that has the variable third width W.

Each of the first dummy gate structure DG1, the second dummy gate structure DG2, and the third dummy gate structure DG3 may include a dummy gate insulating layer DGI on the device isolation layer 140 and the fin structure FS, a dummy gate filling layer DGL on the dummy gate insulating layer DGI, and a dummy gate capping layer DGC on the dummy gate filling layer DGL. The dummy gate insulating layer DGI may include, e.g., silicon oxide, silicon nitride, or a combination thereof. The dummy gate filling layer DGL may include, e.g., polysilicon. The dummy gate capping layer DGC may include, e.g., silicon nitride.

Figure 5A:
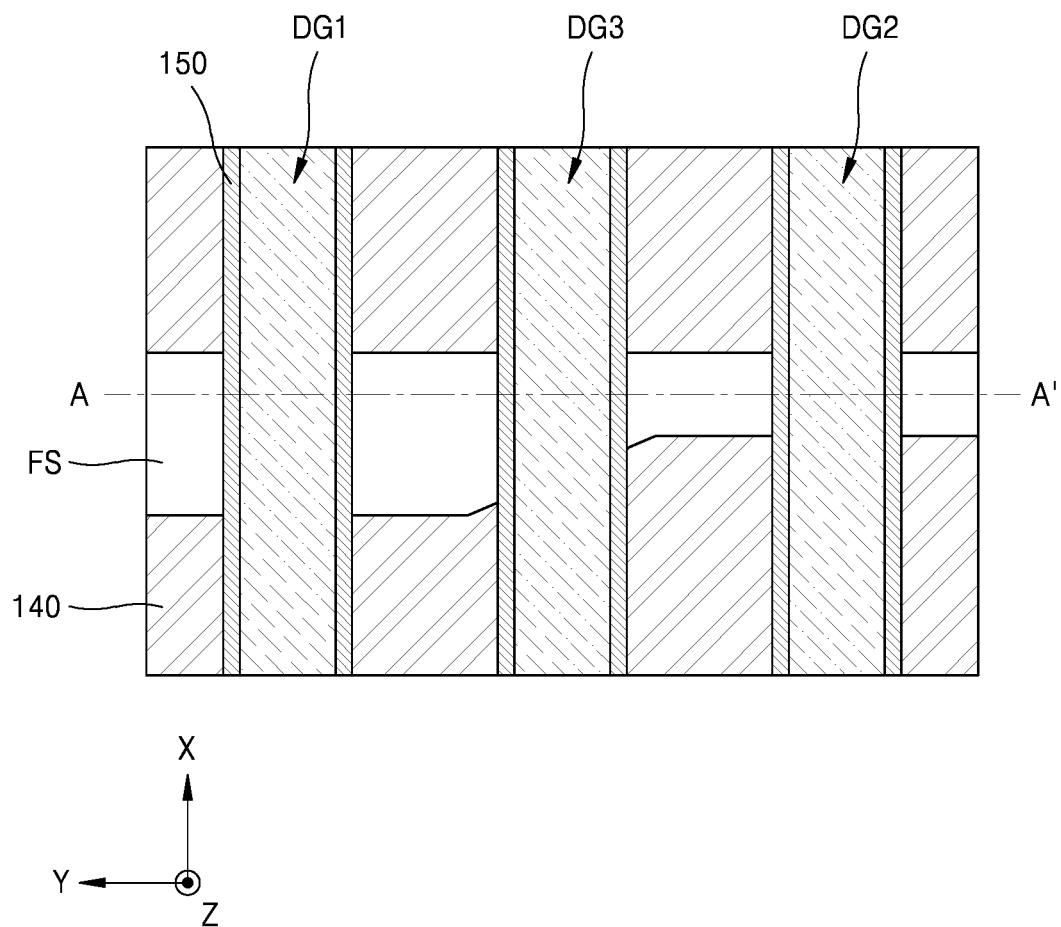
Figure 5B:
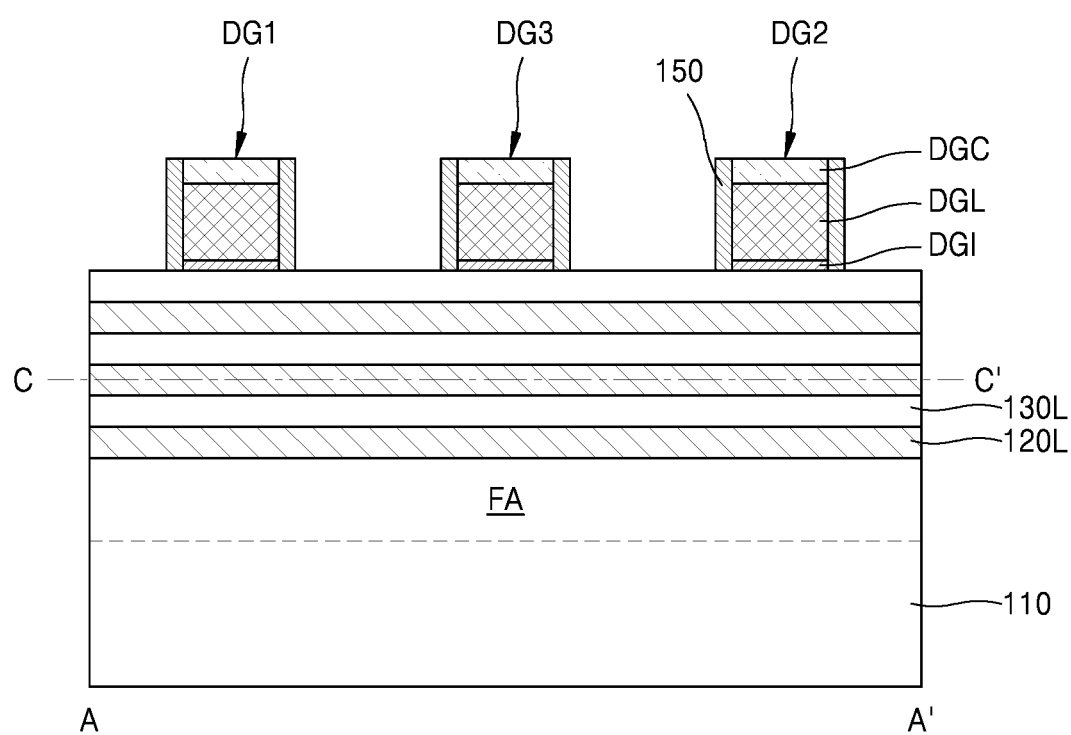
Figure 5C:
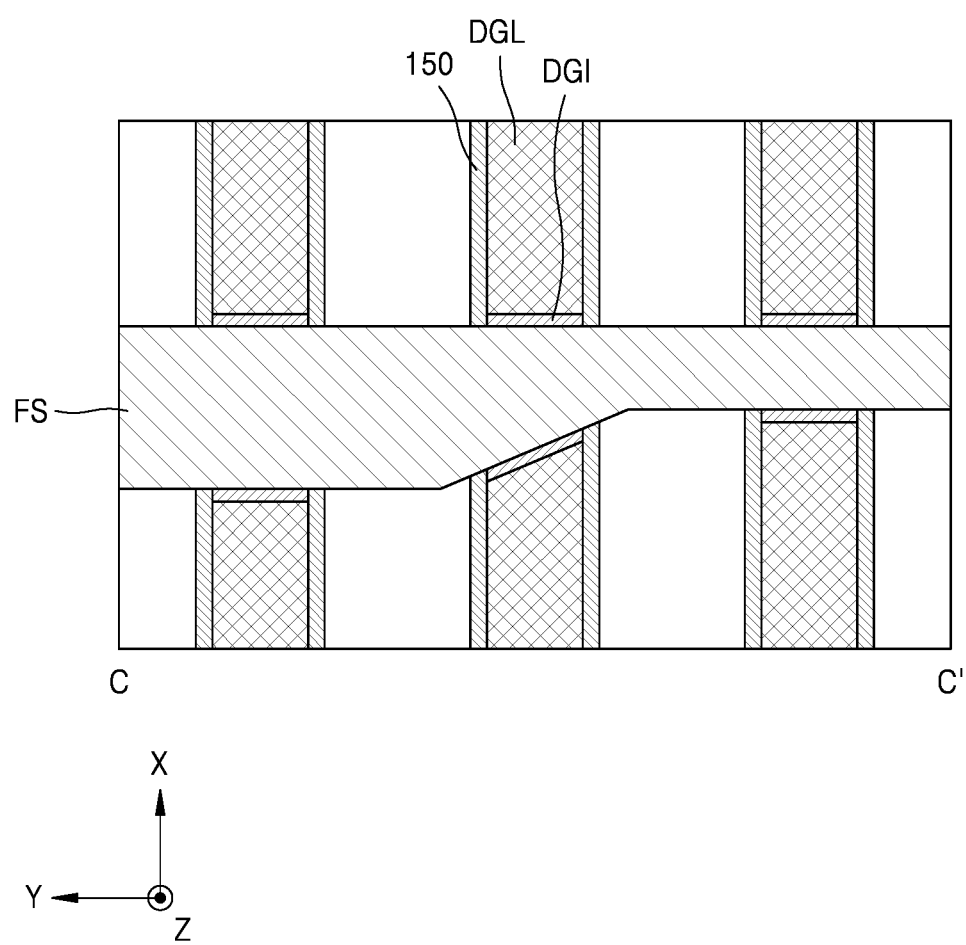

Referring to FIGS. 5A to 5C, the spacer 150 may be formed on both sides of each of the first to third dummy gate structures DG1 to DG3. For example, the spacer 150 may be formed by forming a spacer layer on the fin structure FS and each of the first to third dummy structures DG1 to DG3, and anisotropically etching the spacer layer.

Figure 6A:
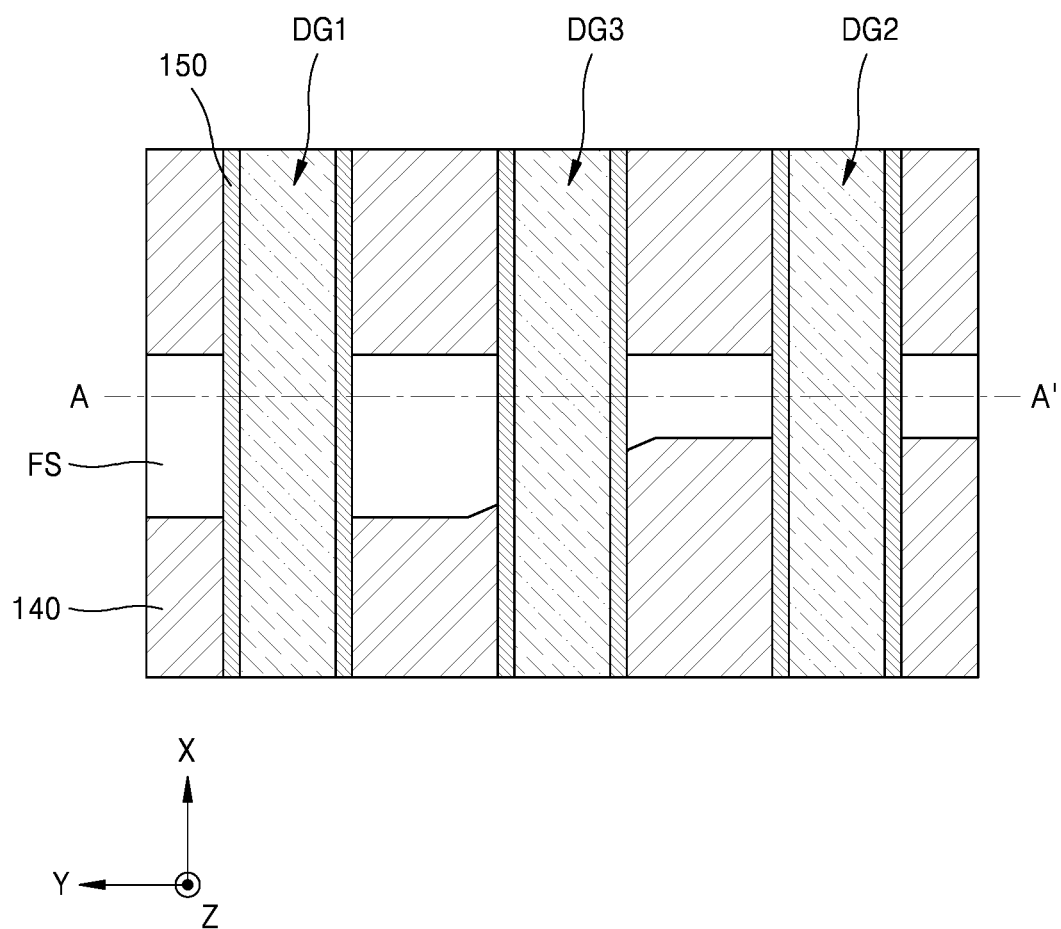
Figure 6B:
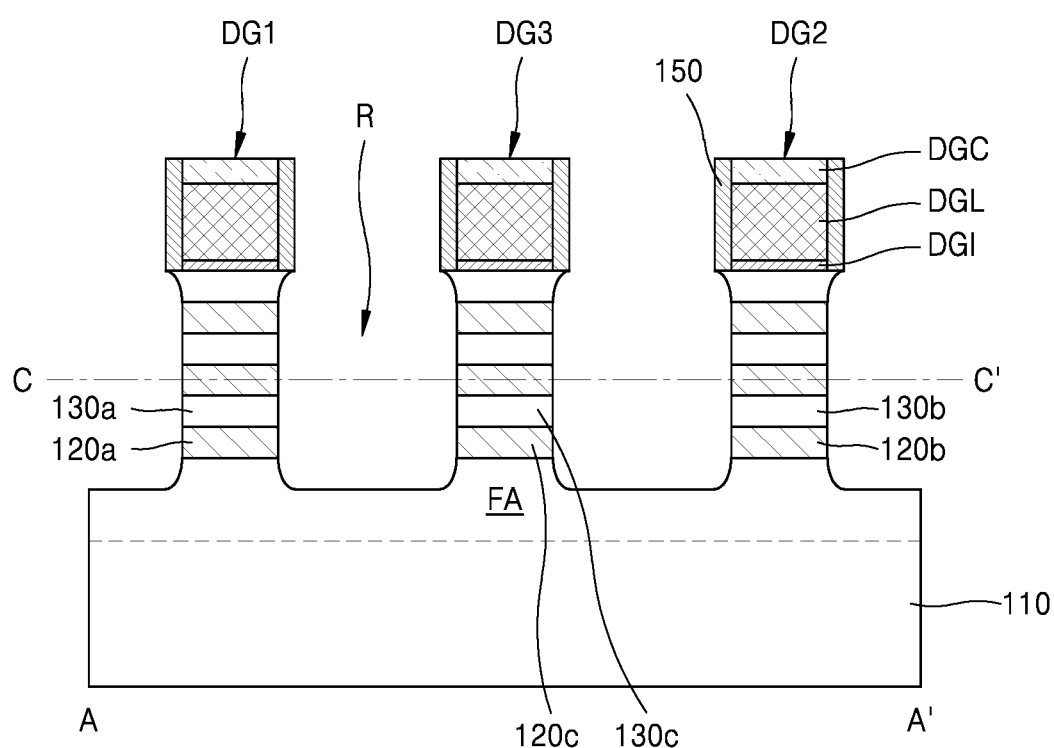
Figure 6C:
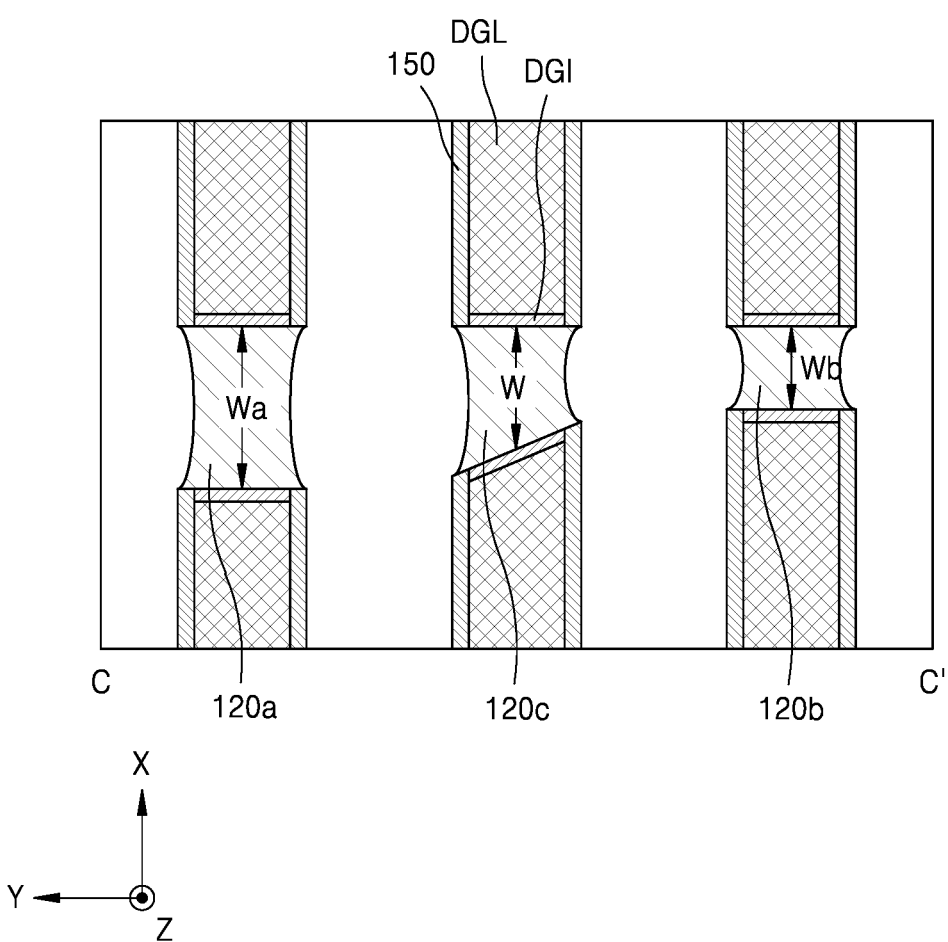

Referring to FIGS. 6A to 6C, a plurality of recesses R may be formed in the fin structure FS by etching the fin structure FS by using the first to third dummy structures DG1 to DG3 and the spacers 150 as an etching mask. One of the plurality of sacrificial layers 120L (see FIG. 5) may be separated into the first sacrificial pattern 120a, the second sacrificial pattern 120b, and the third sacrificial pattern 120c by forming the plurality of recesses R. In addition, one of the plurality of channel layers 130L (see FIG. 5B) may be separated into the first channel 130a, the second channel 130b, and the third channel 130c by forming the plurality of recesses R. The first sacrificial pattern 120a may have the first width Wa. The second sacrificial pattern 120b may have the second width Wb. The third sacrificial pattern 120c may have the third width W, which varies. The third width W of the third sacrificial pattern 120c may be tapered.

The plurality of recesses R may expose the fin-type active area FA, the plurality of first channels 130a, the plurality of second channels 130b, the plurality of third channels 130c, the plurality of first sacrificial patterns 120a, the plurality of second sacrificial patterns 120b, and the plurality of third sacrificial patterns 120c.

Figure 7A:
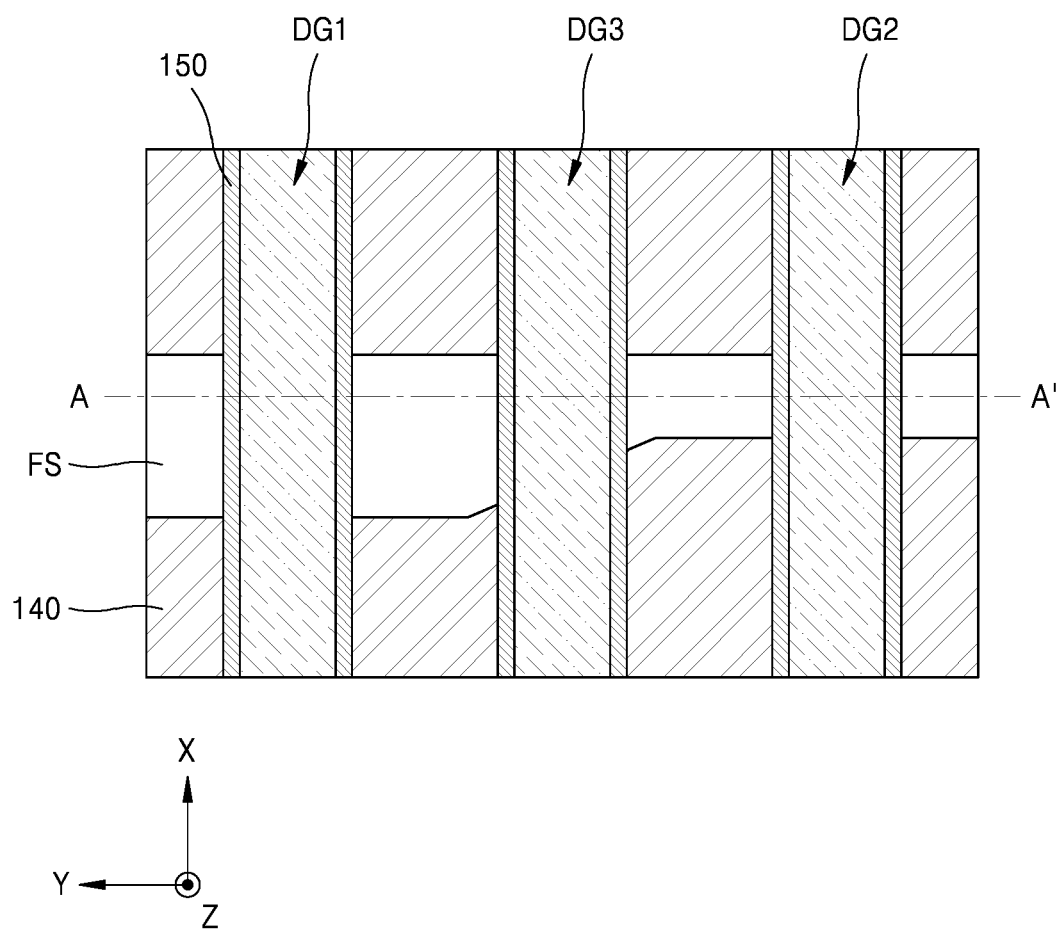
Figure 7B:
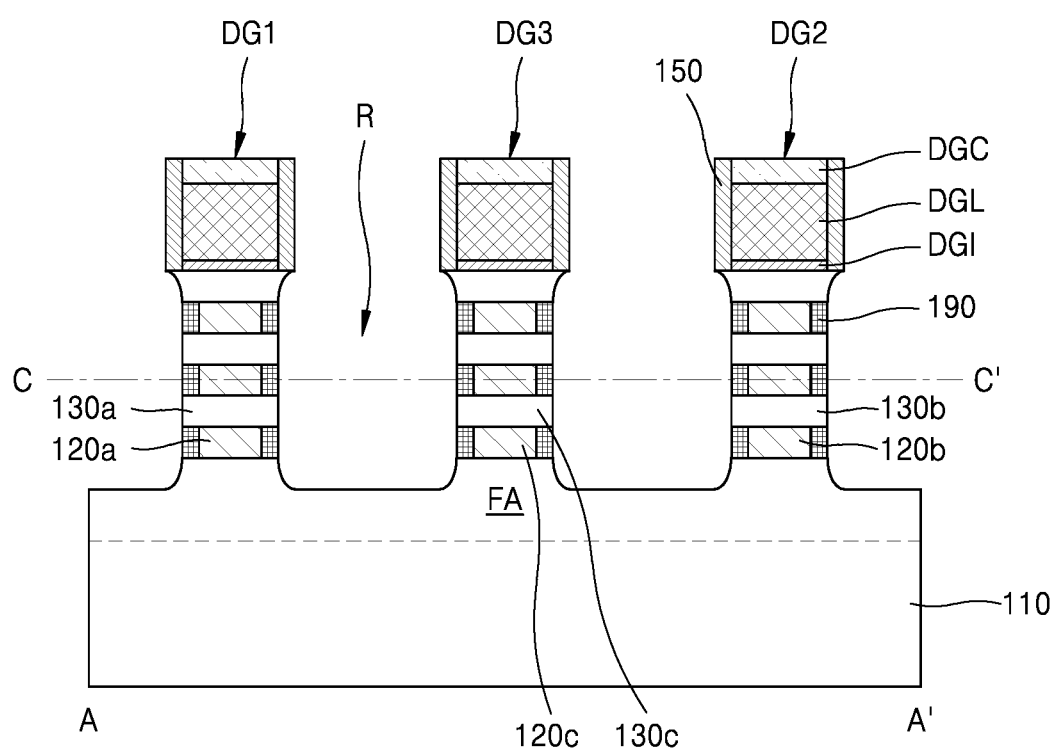
Figure 7C:
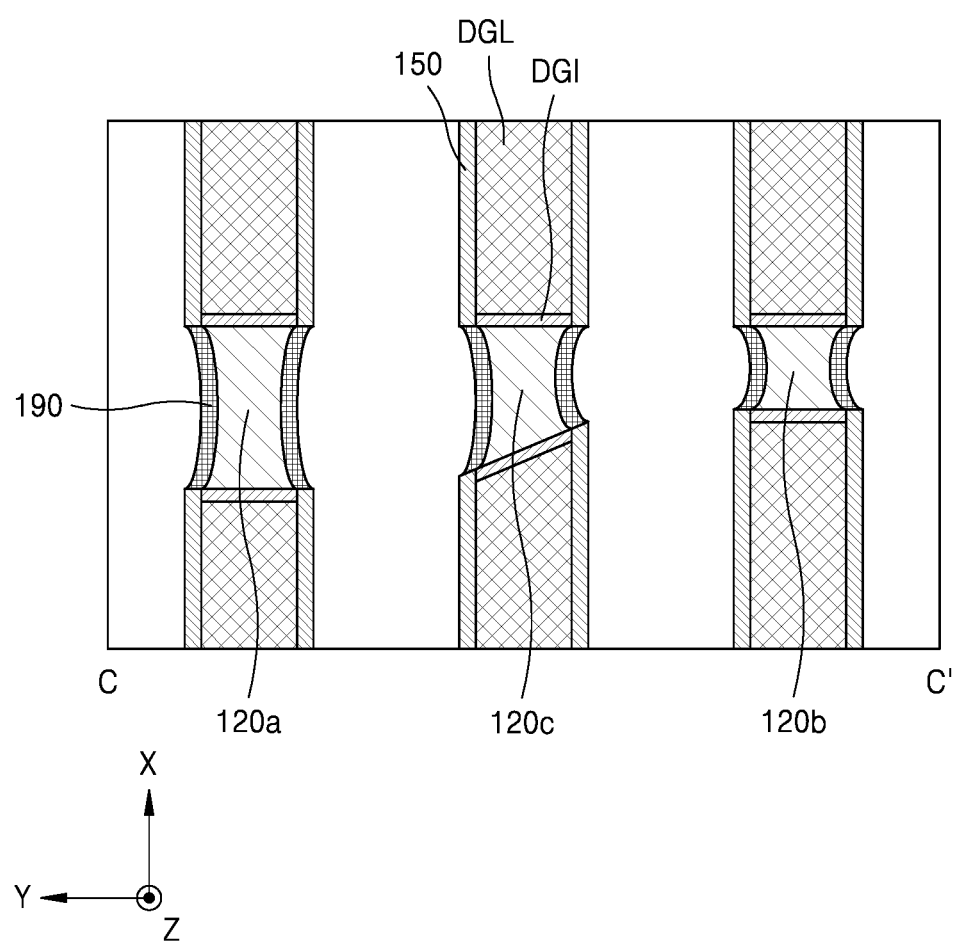

Referring to FIGS. 7A to 7C, the internal spacer 190 may be formed on both sides of each of the first sacrificial pattern 120a, the second sacrificial pattern 120b, and the third sacrificial pattern 120c. In some embodiments, an operation of forming the internal spacer 190 may be omitted.

Figure 8A:
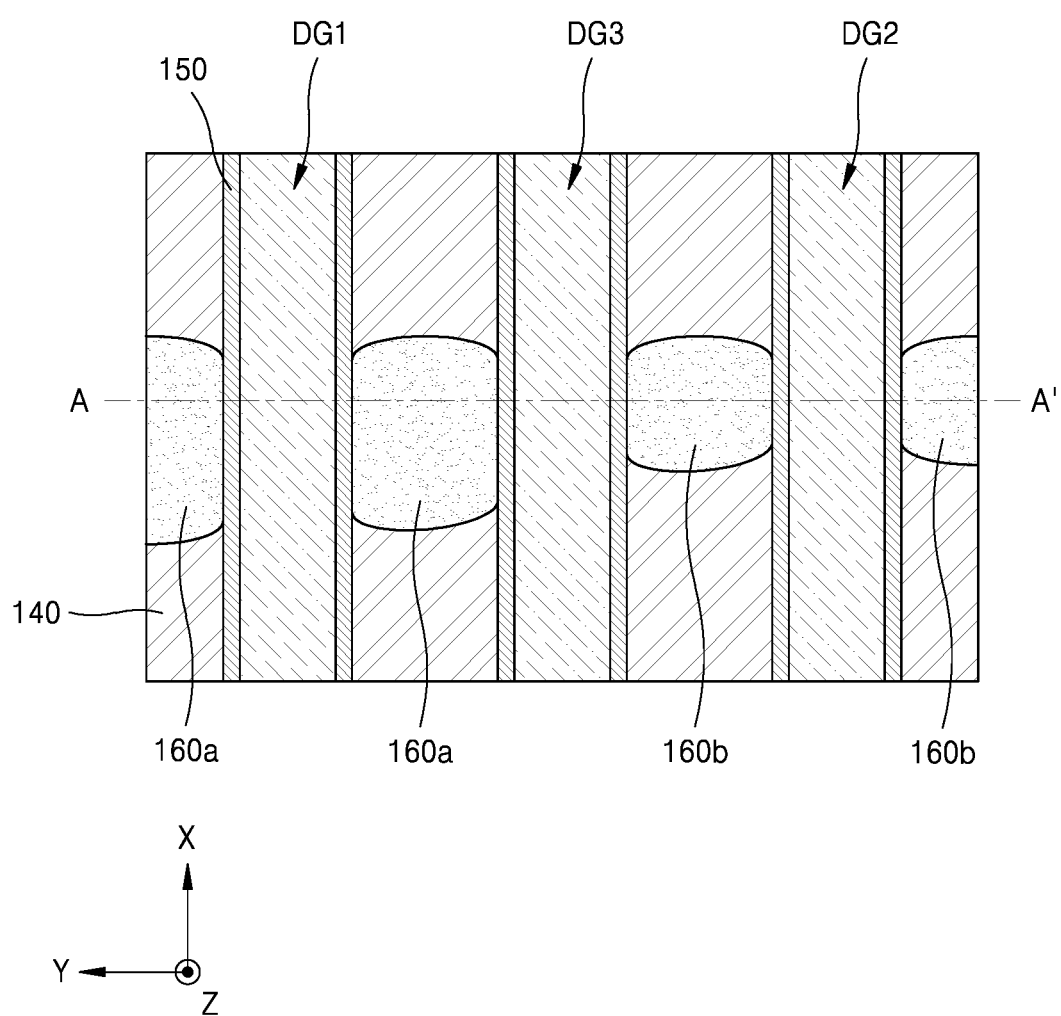
Figure 8B:
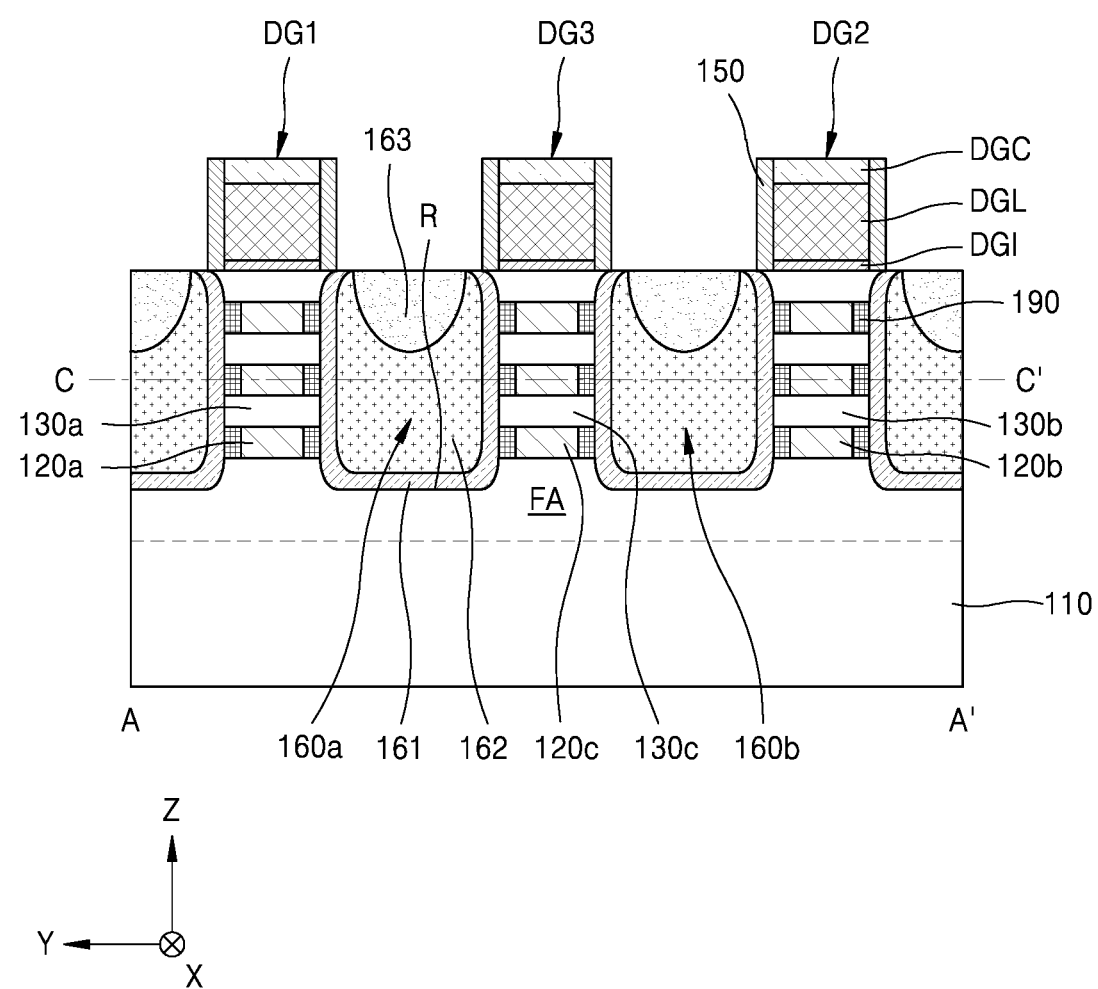
Figure 8C:
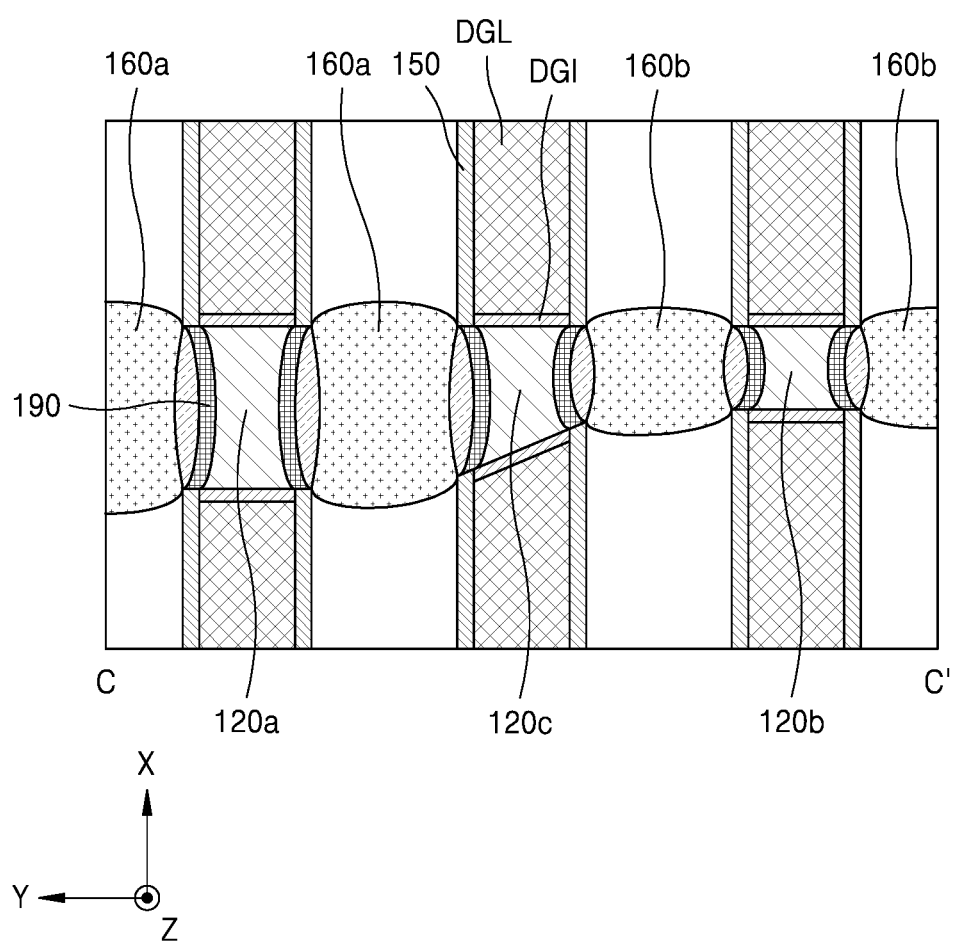

Referring to FIGS. 8A to 8C, the first source/drain structure 160a and the second source/drain structure 160b may be formed in the plurality of recesses R. For example, the first source/drain layer 161, the second source/drain layer 162, and the third source/drain layer 163 may be sequentially and epitaxially grown in the plurality of recesses R. The first source/drain layer 161 may be epitaxially grown from the plurality of first channels 130a, the plurality of second channels 130b, the plurality of third channels 130c, the plurality of first sacrificial patterns 120a, the plurality of second sacrificial patterns 120b, and the plurality of third sacrificial patterns 120c, which are exposed by the plurality of recesses R. The second source/drain layer 162 may be epitaxially grown from the first source/drain layer 161. The third source/drain layer 163 may be epitaxially grown from the second source/drain layer 162.

Figure 9A:
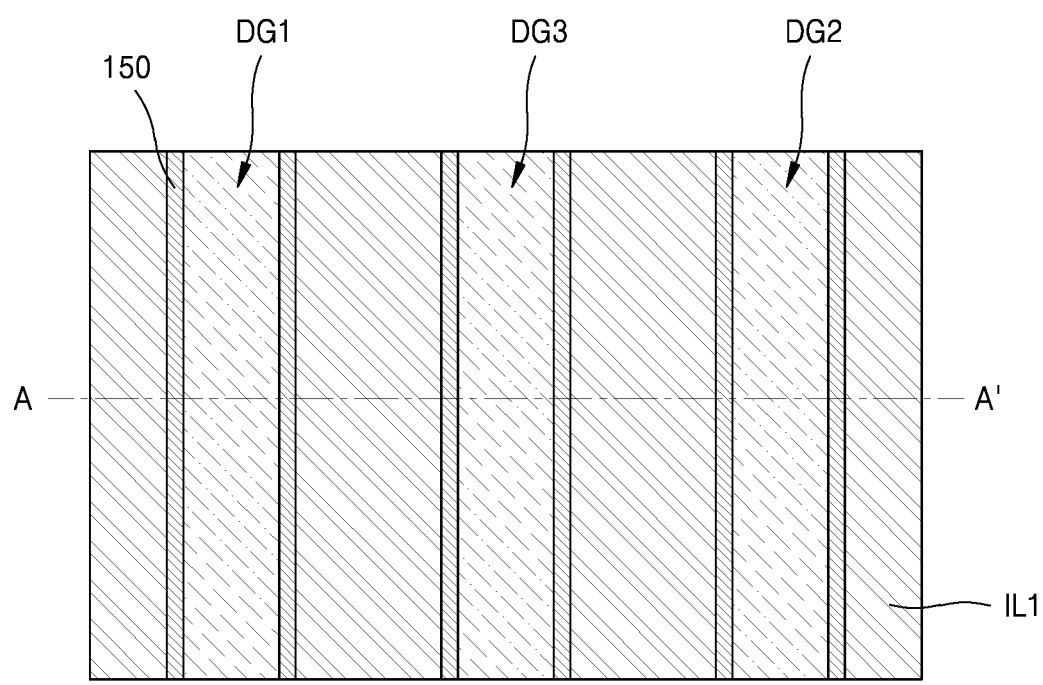
Figure 9A:
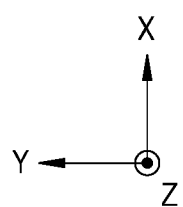
Figure 9B:
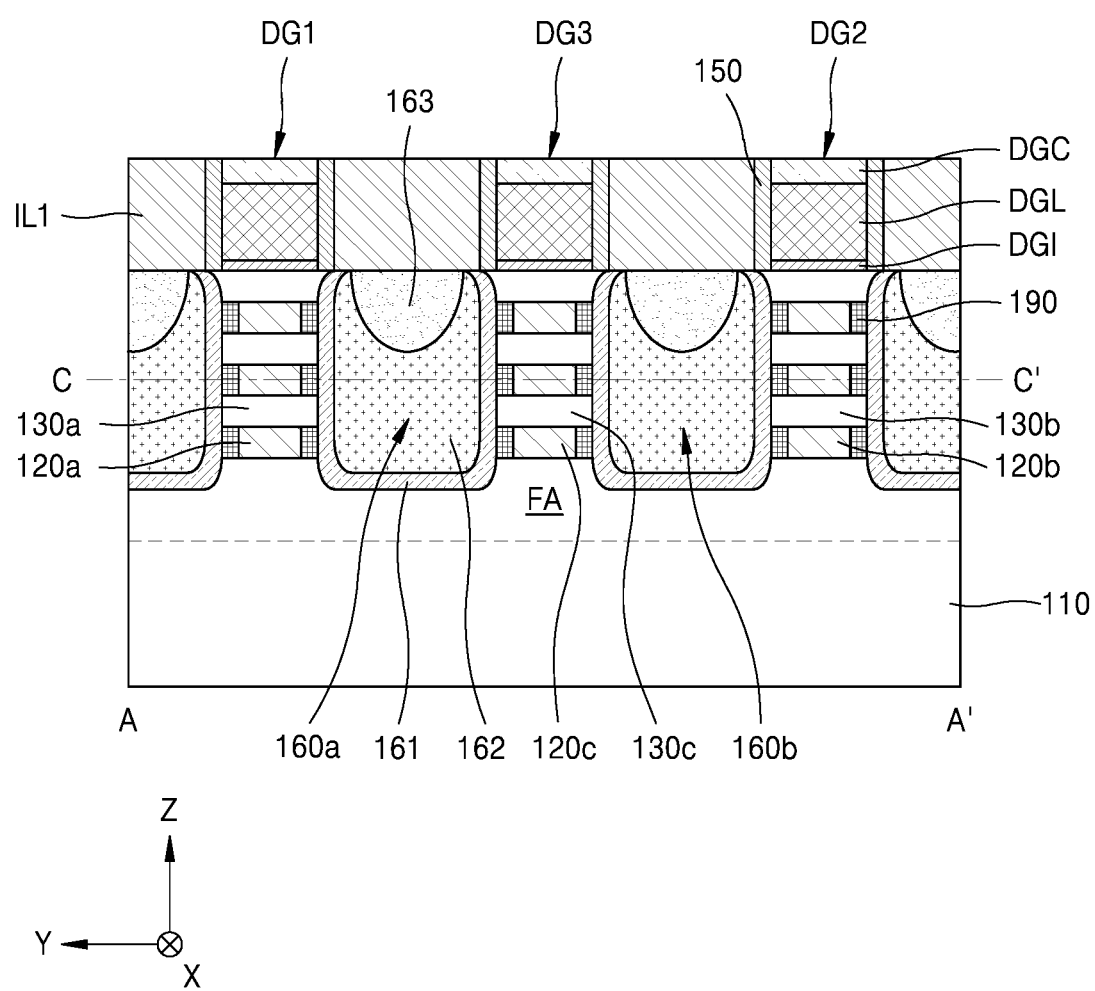
Figure 9C:
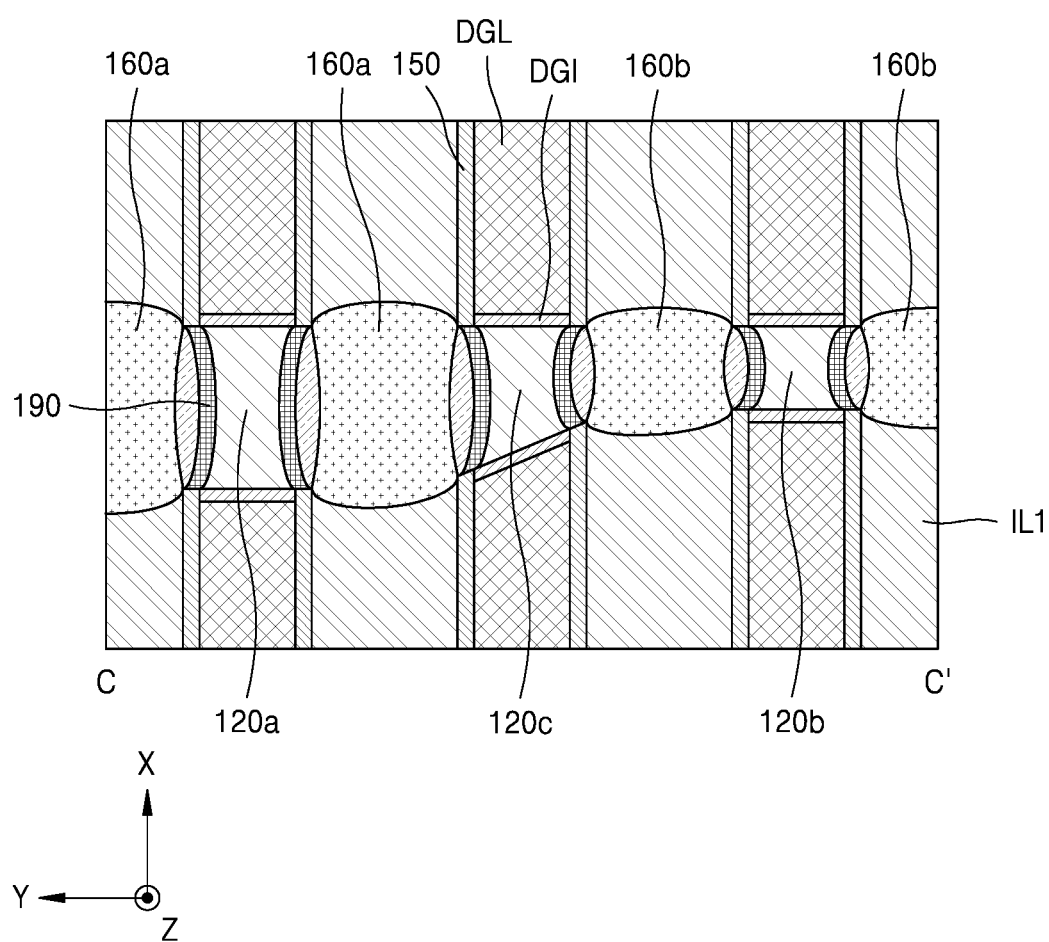

Referring to FIGS. 9A to 9C, the first interlayer insulating layer IL1 may be formed on the first source/drain structure 160a, the second source/drain structure 160b, and the spacer 150. The first interlayer insulating layer IL1 may be planarized such that the dummy gate capping layer DGC of each of the first dummy gate structure DG1, the second dummy gate structure DG2, and the third dummy gate structure DG3 is exposed.

Figure 10A:
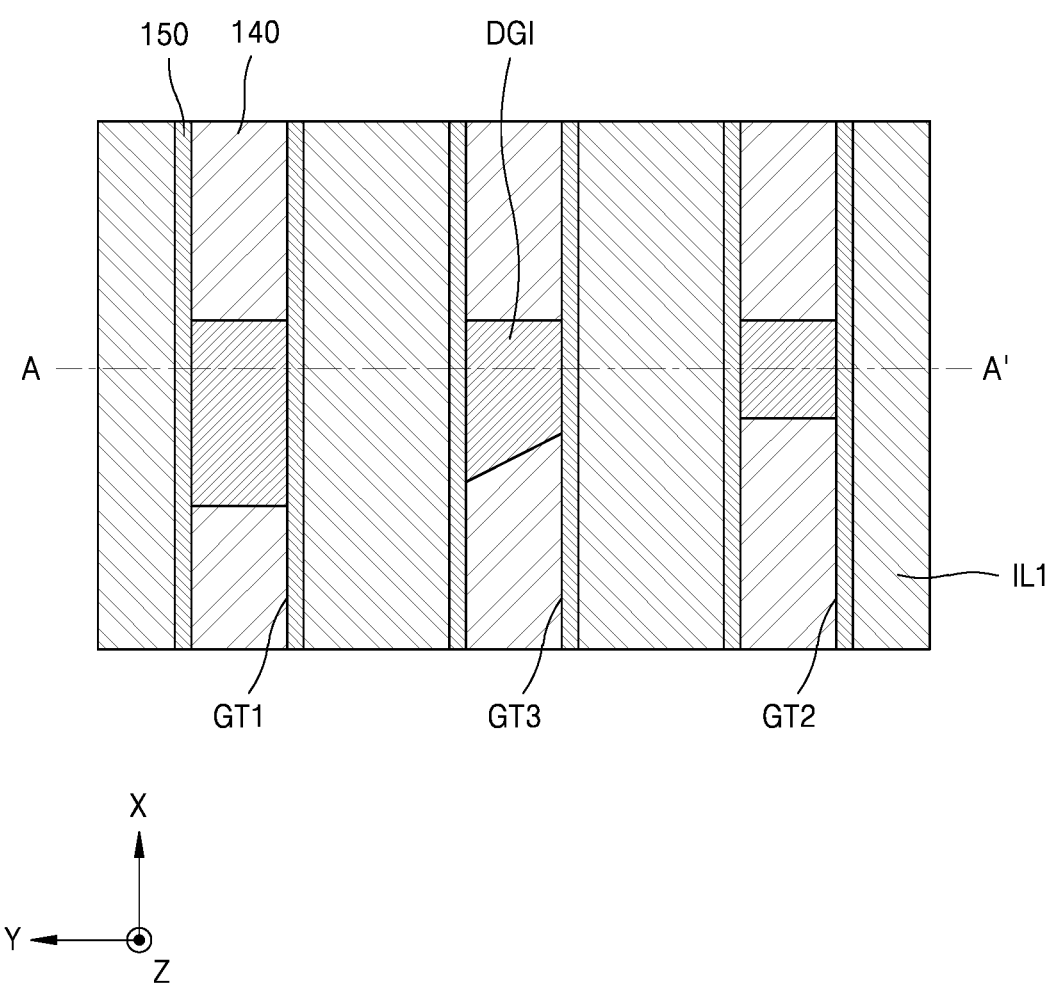
Figure 10B:
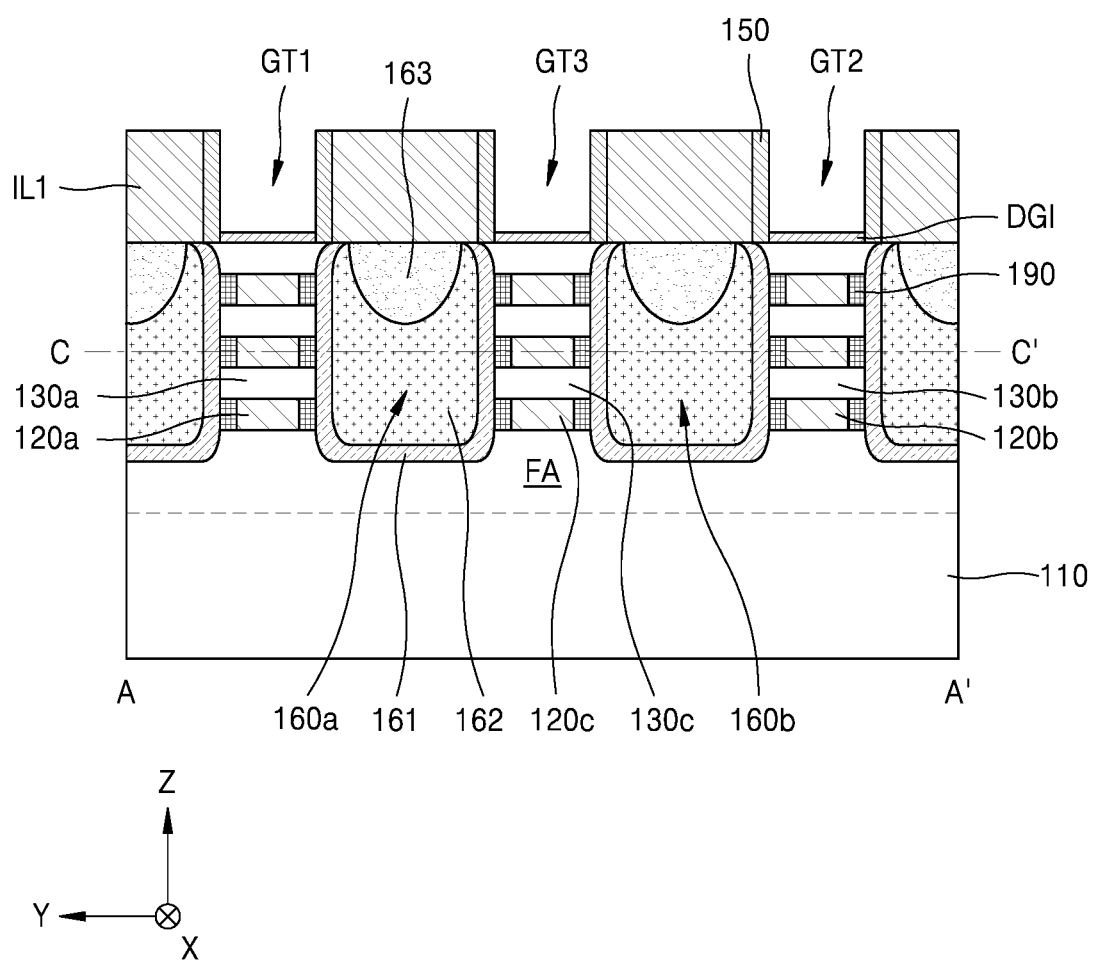
Figure 10C:
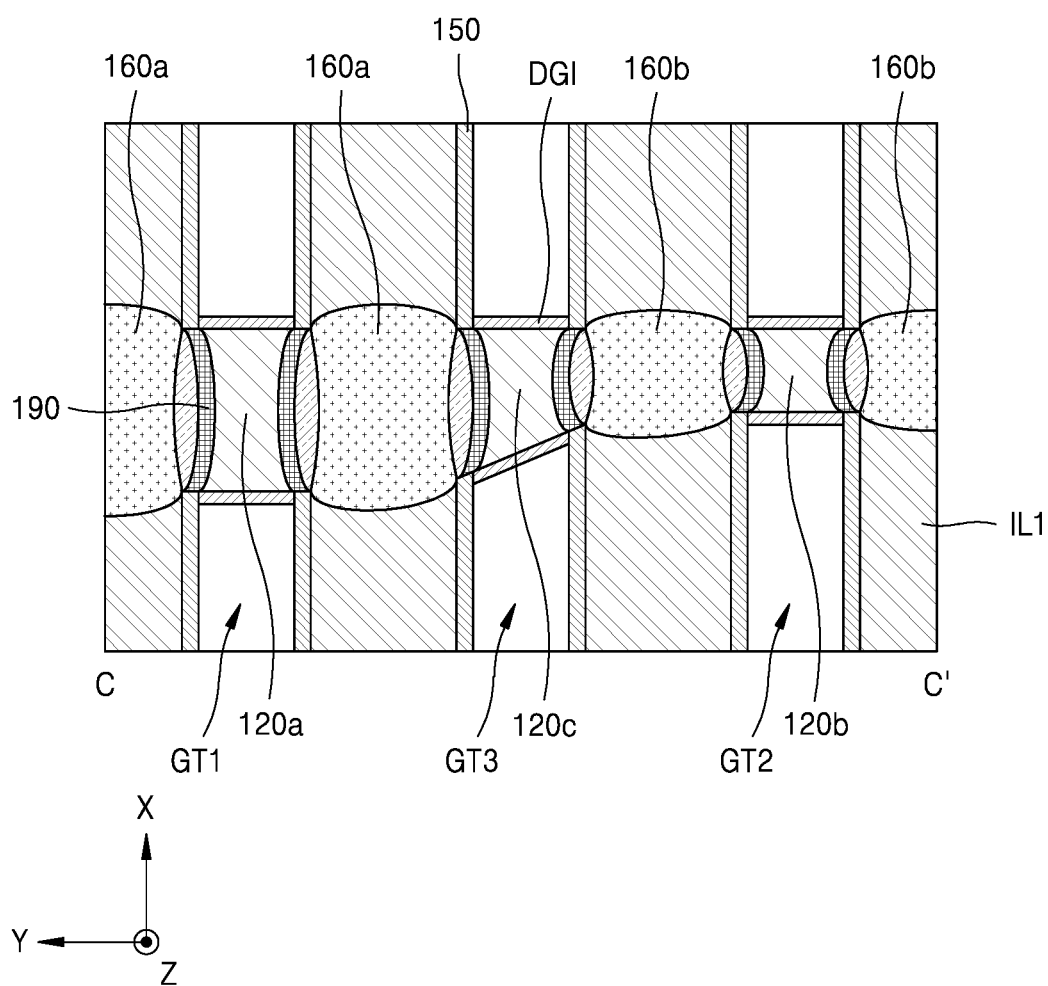

Referring to FIGS. 10A to 10C, the dummy gate capping layer DGC (see FIG. 9B) and the dummy gate filling layer DGL (see FIG. 9B) of each of the first dummy gate structure DG1 (see FIG. 9B), the second dummy gate structure DG2 (see FIG. 9B), and the third dummy gate structure DG3 (see FIG. 9B) may be removed. A first gate trench GT1 may be formed by removing the dummy gate capping layer DGC (see FIG. 9B) and the dummy gate filling layer DGL (see FIG. 9B) from the first dummy gate structure DG1 (see FIG. 9B). A second gate trench GT2 may be formed by removing the dummy gate capping layer DGC (see FIG. 9B) and the dummy gate filling layer DGL (see FIG. 9B) from the second dummy gate structure DG2 (see FIG. 9B). A third gate trench GT3 may be formed by removing the dummy gate capping layer DGC (see FIG. 9B) and the dummy gate filling layer DGL (see FIG. 9B) from the third dummy gate structure DG3 (see FIG. 9B). Each of the first gate trench GT1, the second gate trench GT2, and the third gate trench GT3 may expose the spacer 150, the dummy gate insulating layer DGI, and the device isolation layer 140.

Figure 11A:
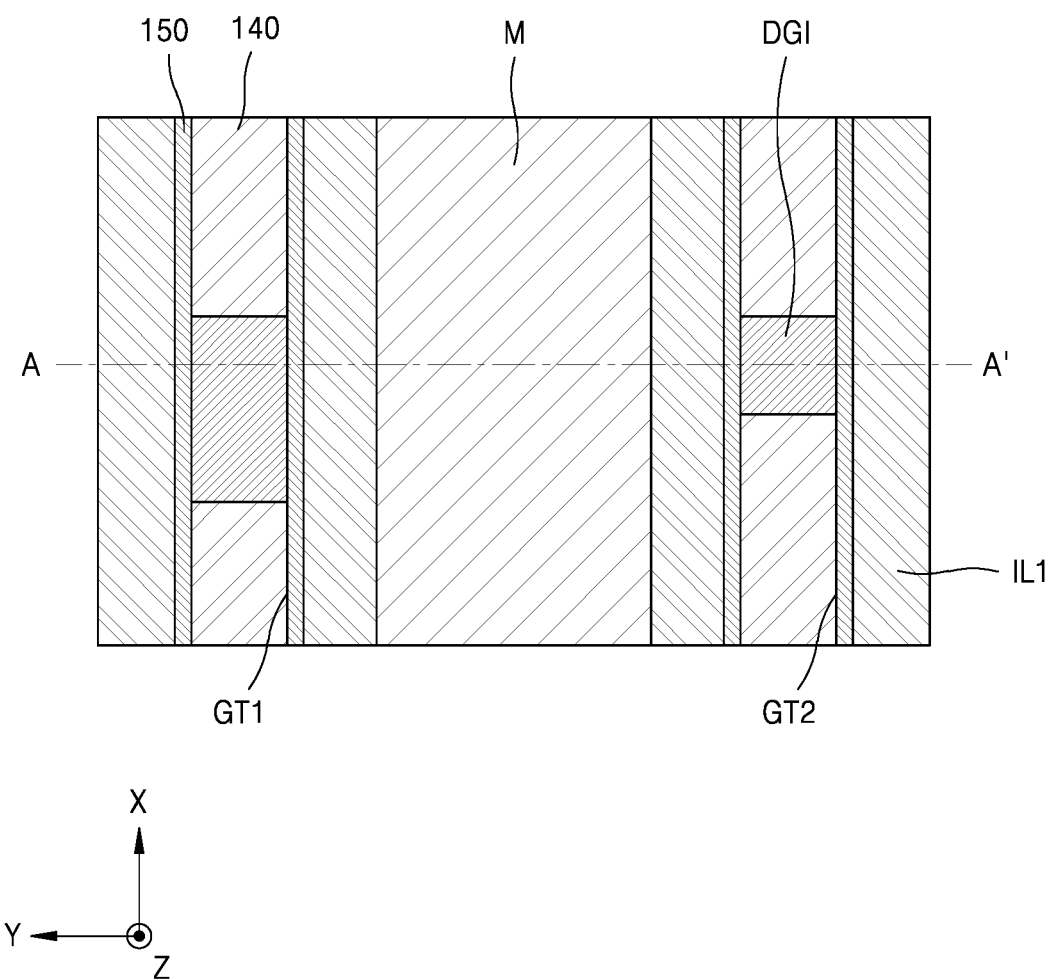
Figure 11B:
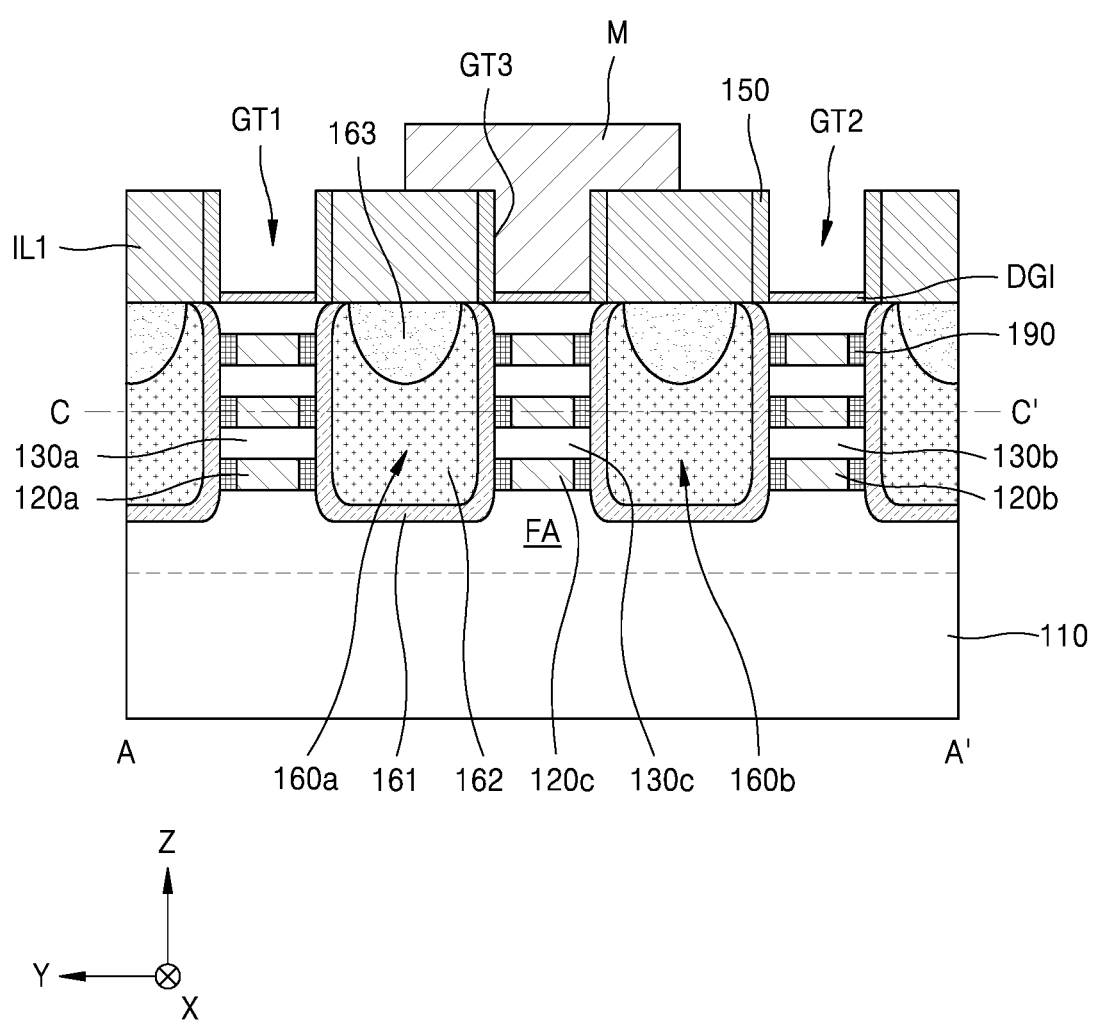
Figure 11C:
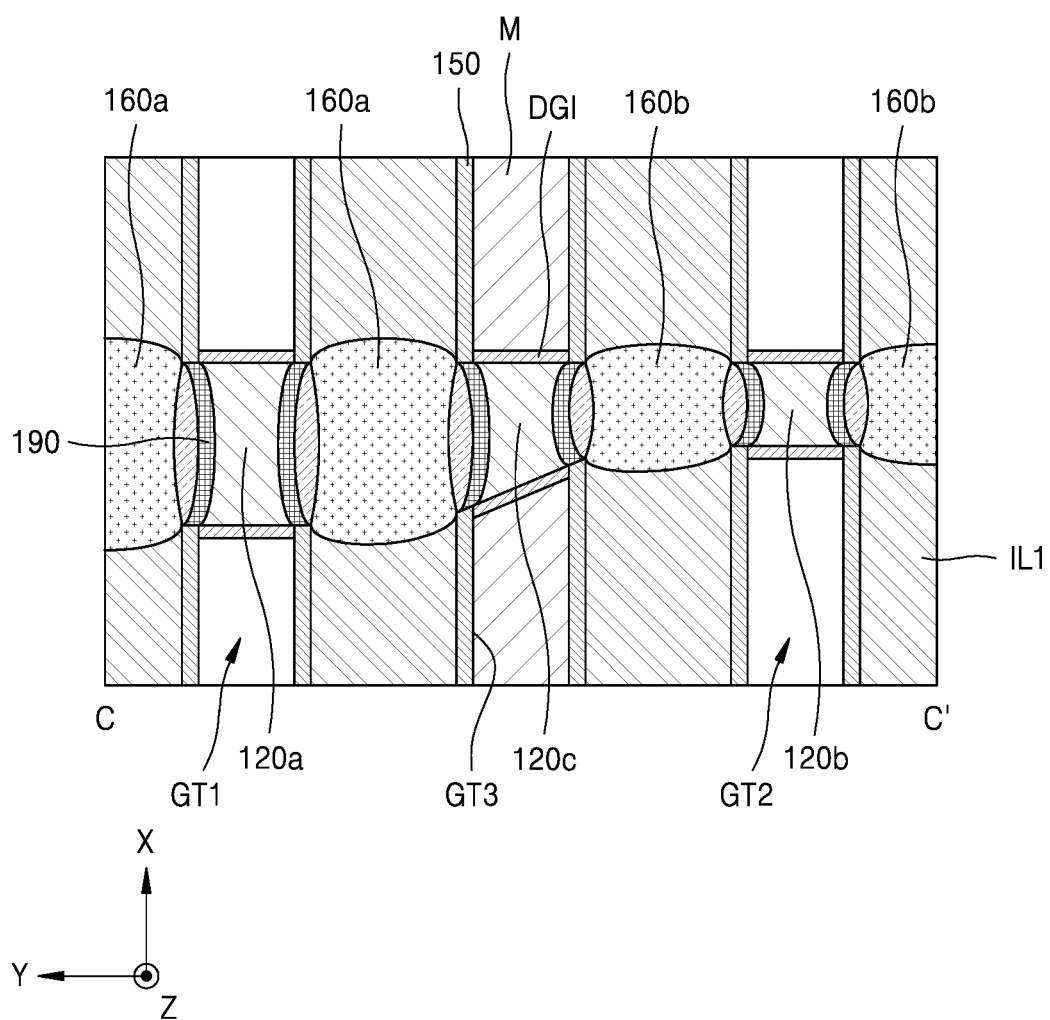

Referring to FIGS. 11A to 11C, a mask M covering the third gate trench GT3 may be formed. The mask M may include, e.g., a photoresist. The mask M may be patterned by photolithography. The mask M may cover the dummy gate insulating layer DGI exposed through the third gate trench GT3. The dummy gate insulating layer DGI exposed through the first gate trench GT1 and the second gate trench GT2 may not be covered by the mask M.

Figure 12A:
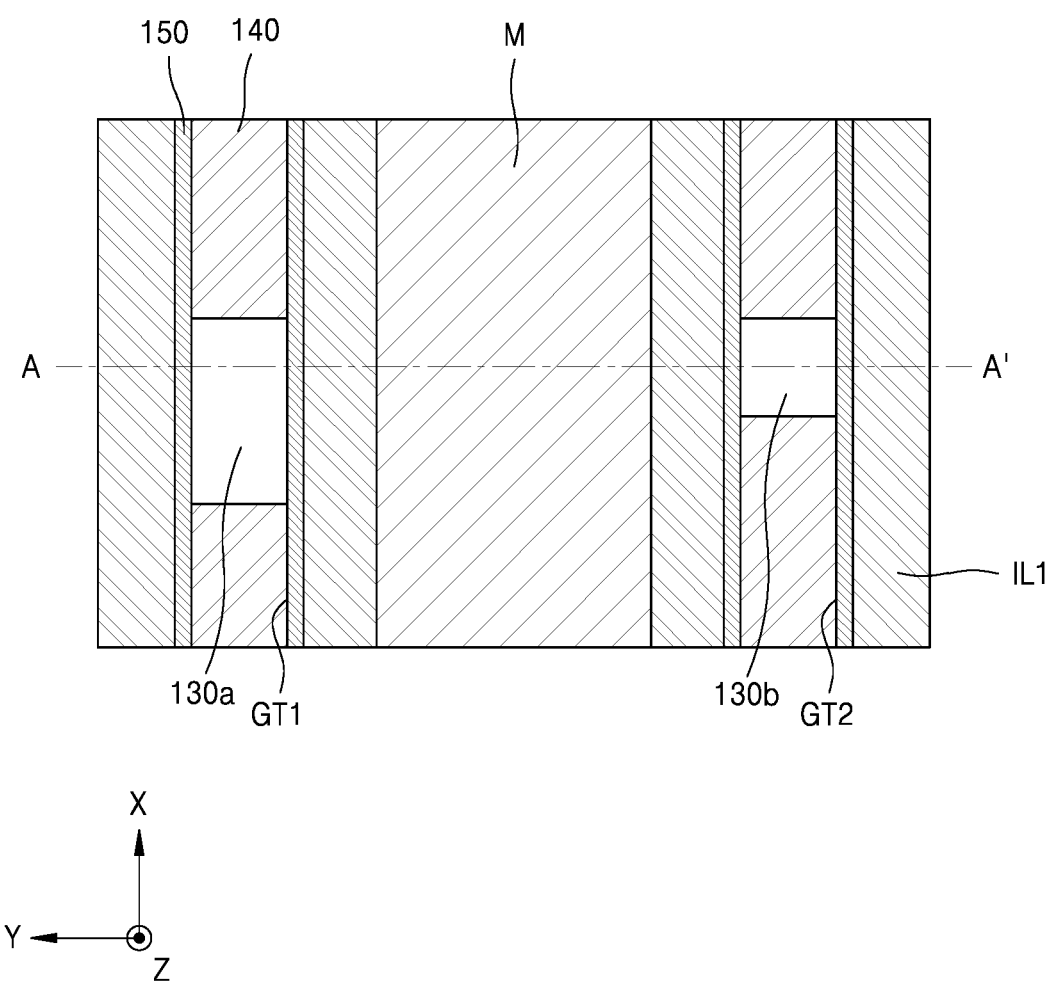
Figure 12B:
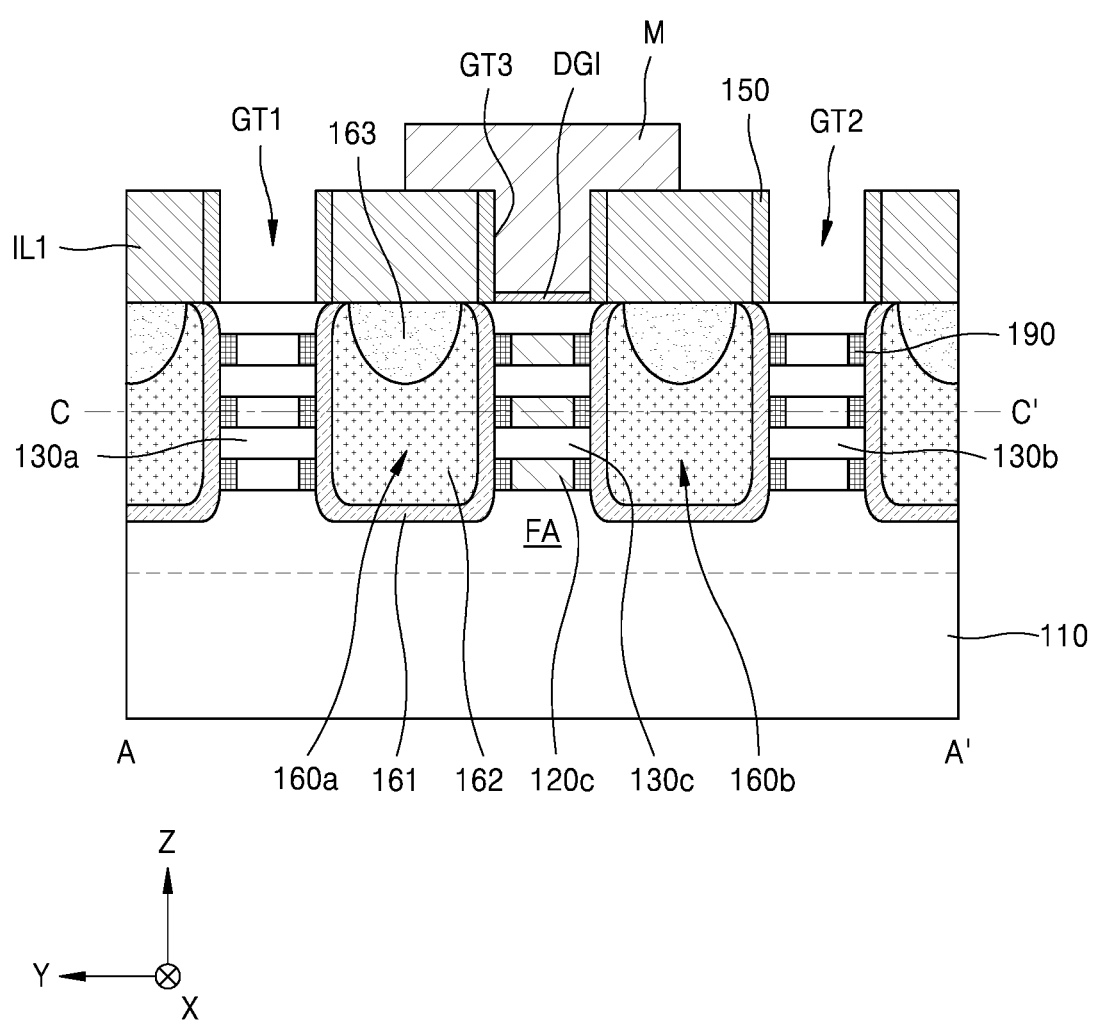
Figure 12C:
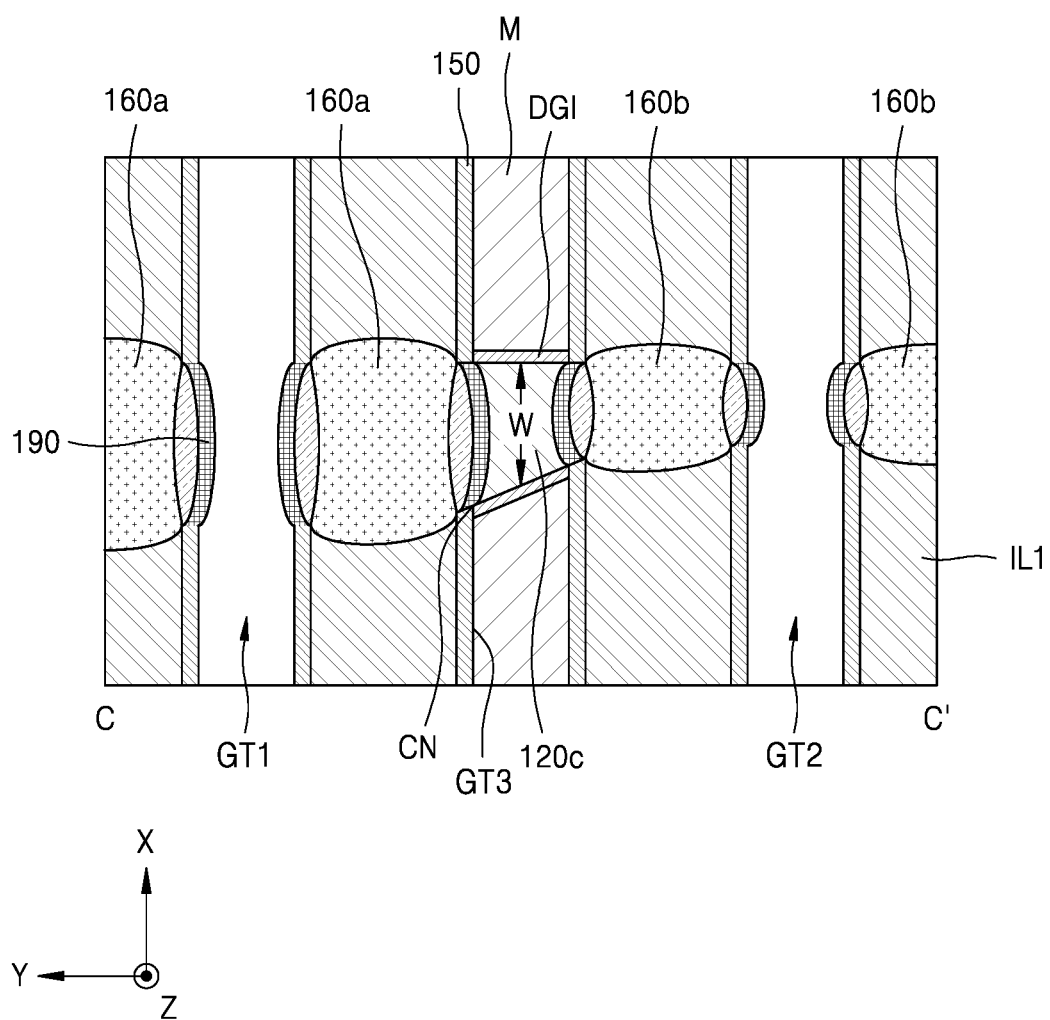
Figure 13A:
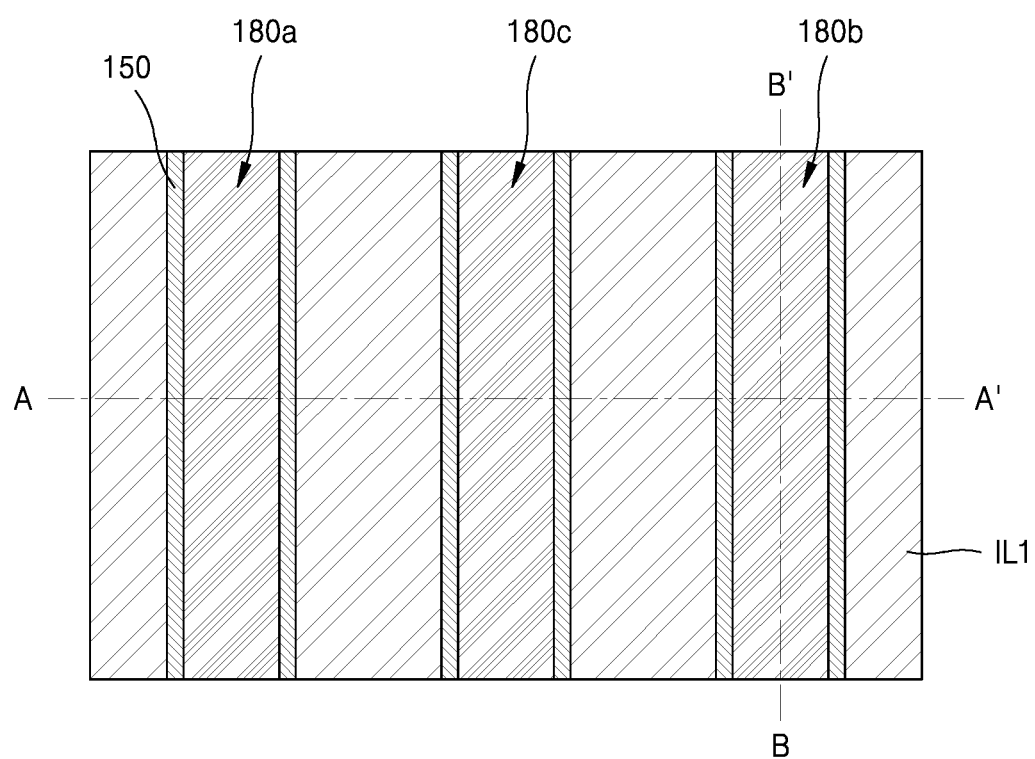
Figure 13B:
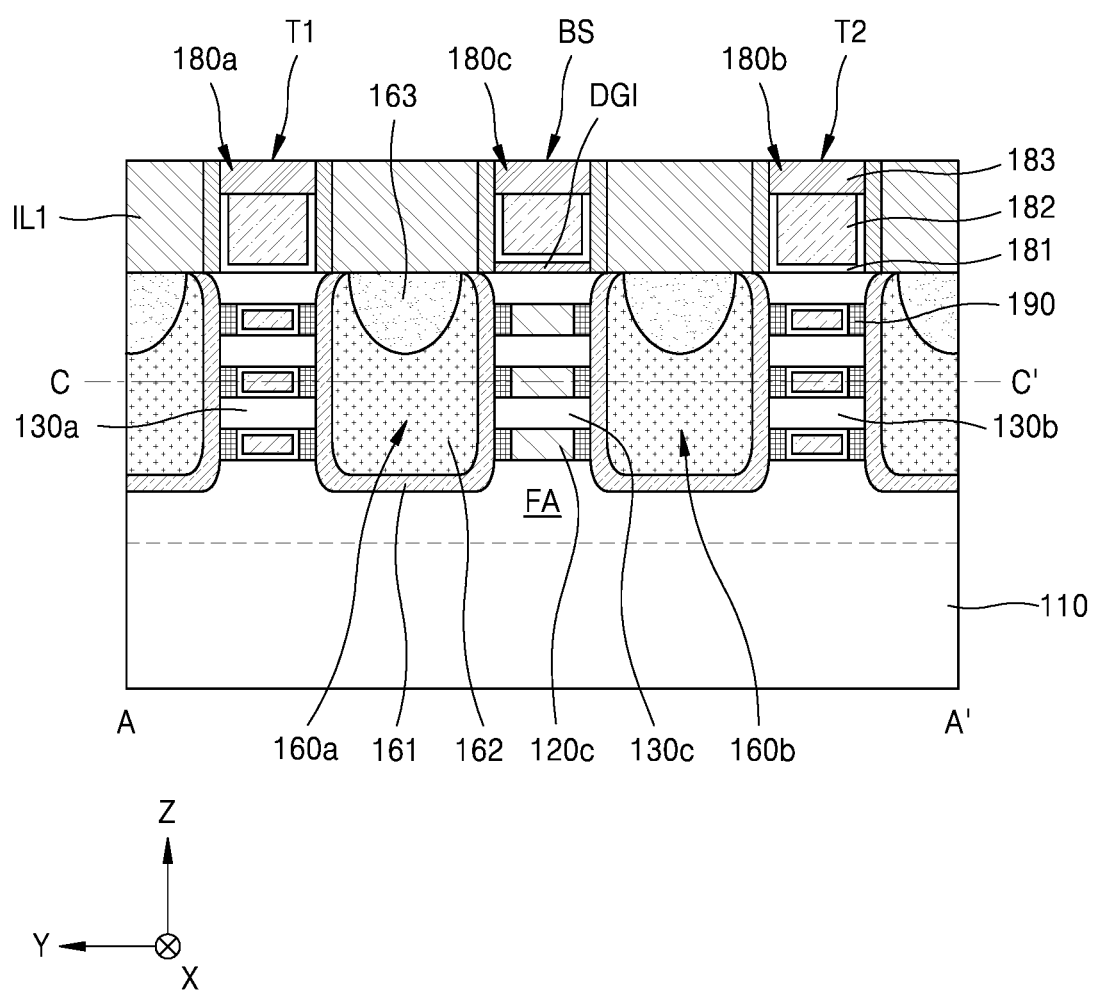
Figure 13C:
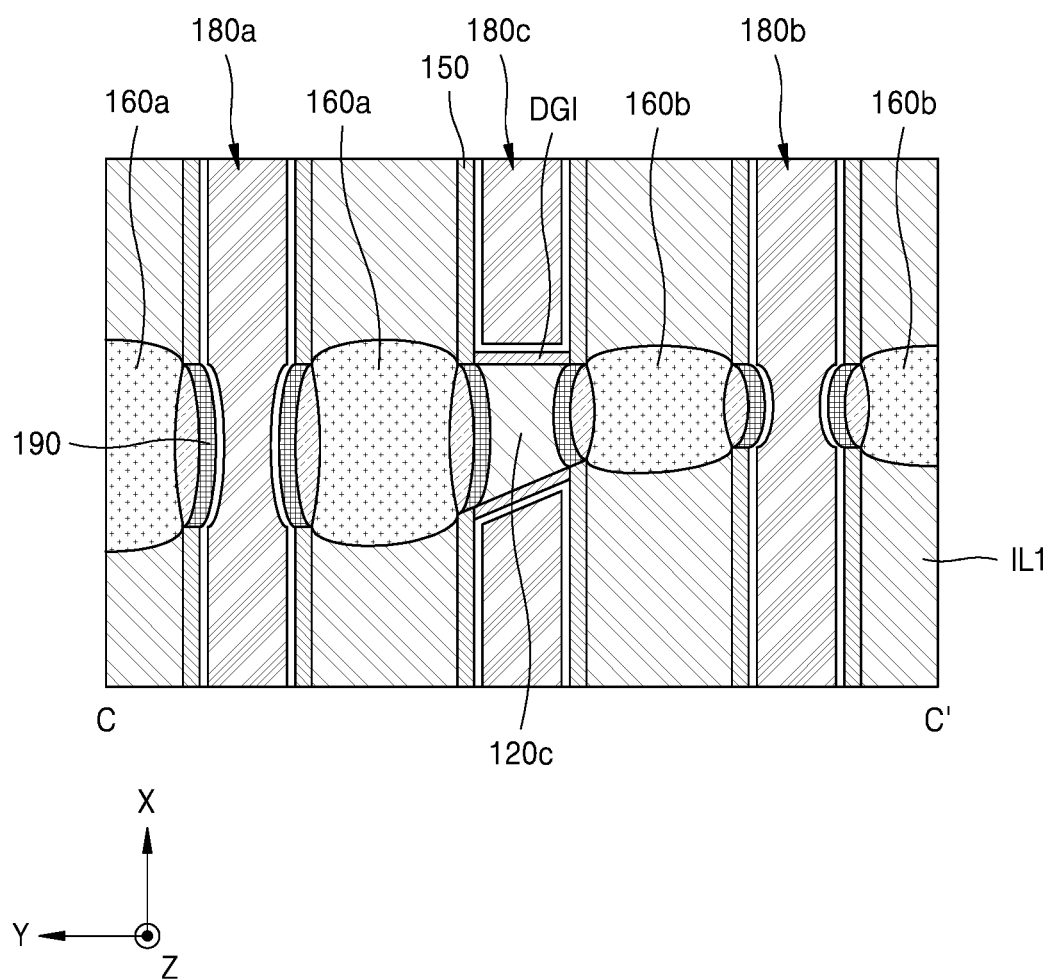
Figure 13D:
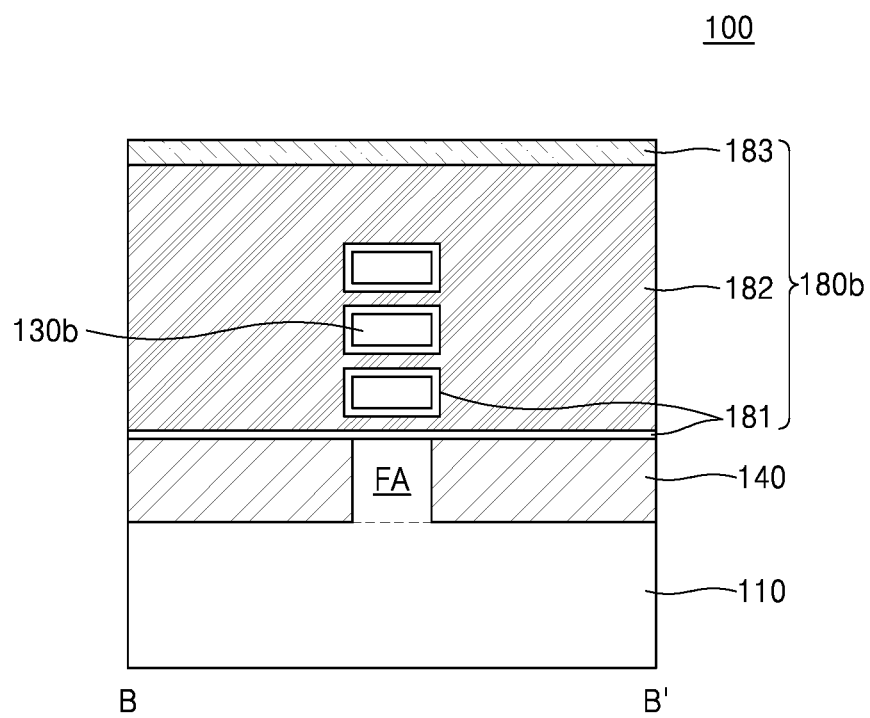

Referring to FIGS. 12A to 12C, the dummy gate insulating layer DGI exposed through the first gate trench GT1 and the second gate trench GT2 may be removed. However, the dummy gate insulating layer DGI in the third gate trench GT3 is covered by the mask M. Therefore, the dummy gate insulating layer DGI in the third gate trench GT3 may remain. The plurality of first channels 130a and the plurality of first sacrificial patterns 120a (see FIG. 11C) may be exposed through the first gate trench GT1. The plurality of second channels 130b and the plurality of second sacrificial patterns 120b (see FIG. 11C) may be exposed through the second gate trench GT2.

After removing the dummy gate insulating layer DGI, the plurality of first sacrificial patterns 120a (see FIG. 11C) and the plurality of second sacrificial patterns 120b (see FIG. 11c), which are exposed, may be removed. That is, a space between the plurality of first channels 130a and between the plurality of second channels 130b may be formed. However, the third sacrificial pattern 120c may be protected by the dummy gate insulating layer DGI and the mask M and may remain.

The third sacrificial pattern 120c may have the width W in the direction X, which is tapered (i.e., varies along the X direction), and may have a sharp corner CN. If the third sacrificial pattern 120c were not protected by the dummy gate insulating layer DGI and the mask M (e.g., and were exposed to an etchant), the etchant could have reached the first source/drain structure 160a through the sharp corner CN during removal of the third sacrificial pattern 120c, thereby removing a portion of the first source/drain structure 160a and decreasing manufacturing yield. In contrast, according to embodiments, because the third sacrificial pattern 120c is not removed, the first source/drain structure 160a may be prevented from being removed. Accordingly, a decrease in manufacturing yield due to undesired etching of the first source/drain structure 160 may be prevented or substantially minimized.

Referring to FIGS. 13A to 13D, the mask M (see FIGS. 12A to 12C) may be removed. The first gate structure 180a may be formed in a space from which the plurality of first sacrificial patterns 120a (see FIG. 11C) are removed and the first gate trench GT1 (see FIG. 12B). At the same time, the second gate structure 180b may be formed in a space from which the plurality of second sacrificial patterns 120b (see FIG. 11C) are removed and the second gate trench GT2 (see FIG. 12B). At the same time, the third gate structure 180c may be formed in the third gate trench GT3 (see FIG. 12B). The first gate structure 180a may surround the plurality of first channels 130a, and the second gate structure 180b may surround the plurality of second channels 130b, but the third gate structure 180c may not surround the plurality of third channels 130c.

In detail, the gate insulating layer 181 may be conformally formed to surround the plurality of first channels 130a and the plurality of second channels 130b. In addition, the gate insulating layer 181 may be formed on the dummy gate insulating layer DGI in the second gate trench GT2. The gate electrode layer 182 may be formed on the gate insulating layer 181 to fill the first gate trench GT1, the second gate trench GT2 and the third gate trench GT3, a space between the plurality of first channels 130a, and a space between the plurality of second channels 130b. Next, upper portions of the gate insulating layer 181 and the gate electrode layer 182 may be removed, and the resultant space may be filled by the gate capping layer 183.

The first transistor T1 including the pair of first source/drain structures 160a, the plurality of first channels 130a extending between the pair of first source/drain structures 160a and apart from each other in the vertical direction (the Z-direction), and the first gate structure 180a surrounding the plurality of first channels 130a and extending in the first horizontal direction (the X-direction) may be completed. In addition, at the same time, the second transistor T2 including the pair of second source/drain structures 160b, the plurality of second channels 130b extending between the pair of second source/drain structures 160b and apart from each other in the vertical direction (the Z-direction), and the second gate structure 180b surrounding the plurality of second channels 130b and extending in the first horizontal direction (the X-direction) may be completed. In addition, at the same time, the boundary structure BS including the plurality of third channels 130c extending between one of the pair of first source/drain structures 160a and one of the pair of second source/drain structures 160b and apart from each other in the vertical direction (the Z-direction), the plurality of sacrificial patterns 120c respectively between the plurality of third channels 130c, and the third gate structure 180c in contact with an uppermost one of the plurality of third channels 130c and extending in the first horizontal direction (the X-direction) may be manufactured.

Referring to FIGS. 1A to 1E, the second interlayer insulating layer IL2 may be formed on the first interlayer insulating layer IL1, the first gate structure 180a, the second gate structure 180b, and the third gate structure 180c. Next, a plurality of contact holes 171H penetrating the first interlayer insulating layer IL1 and the second interlayer insulating layer IL2 and exposing the first source/drain structure 160a and the second source/drain structure 160b may be formed. The contact 171 may be formed in each of the plurality of contact holes 171H. The silicide layer 172 may be further formed between the contact 171 and the first source/drain structure 160a and between the contact 171 and the second source/drain structure 160b.

Then, the trench T penetrating the boundary structure BS and extending in the first horizontal direction (the X-direction) may be formed. However, in another embodiment, the trench T may be formed before forming the contact 171. The trench T may penetrate the third gate structure 180c, the plurality of third channels 130c, and the plurality of third sacrificial patterns 120c. In some embodiments, the trench T may further penetrate the plurality of spacers 150 on side surfaces of the third gate structure 180c. In some embodiments, the trench T may further penetrate the plurality of internal spacers 190 between the third sacrificial pattern 120c and the first source/drain structure 160a and between the third sacrificial pattern 120c and the second source/drain structure 160b. In some embodiments, the third gate structure 180c may be completely removed by an operation of forming the trench T. In another embodiment, the third gate structure 180c may be partially removed by the operation of forming the trench T, and thus, a portion of the third gate structure 180c may remain. At least one of the plurality of sacrificial patterns 120c may remain despite the operation of forming the trench T. The plurality of third channels 130c may at least partially remain despite the operation of forming the trench T. The trench T may prevent the boundary structure BS, which is not used for an operation of a semiconductor device, from affecting an operation of the first transistor T1 or the second transistor T2. According to the method described with reference to FIGS. 2A to 13D and 1A to 1E, the semiconductor device 100 shown in FIGS. 1A through 1E may be manufactured.

By way of summation and review, embodiments provide a semiconductor device that has improved manufacturing yield. That is, when removing a sacrificial pattern from a first transistor (e.g., multi-bridge-channel field effect transistor (MBCFET)) and a second transistor, a sacrificial pattern may not be removed from a boundary structure between the two transistors. Accordingly, unintended etching of a first source/drain structure may be prevented. Therefore, a manufacturing yield of a semiconductor device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first source/drain structure having a first length in a horizontal direction, as viewed in a planar cross-sectional view, the horizontal direction being perpendicular to a vertical direction;
a second source/drain structure having a second length in the horizontal direction, as viewed in the planar cross-sectional view, the second length being less than the first length;
boundary channels extending between the first source/drain structure and the second source/drain structure, the boundary channels being spaced apart from each other in the vertical direction;
at least one sacrificial pattern between the boundary channels; and
a trench penetrating the boundary channels and the at least one sacrificial pattern, such that the at least one sacrificial pattern includes:
a first portion along the first source/drain structure, the first portion having a first length in the horizontal direction, and
a second portion along the second source/drain structure, the second portion having a second length in the horizontal direction, the second length being less than the first length.

2. The semiconductor device as claimed in claim 1, wherein the at least one sacrificial pattern includes a plurality of sacrificial patterns between some adjacent ones of the boundary channels, the trench penetrating the plurality of sacrificial patterns, and each of the plurality of sacrificial patterns including the first and second portions.

3. The semiconductor device as claimed in claim 1, wherein the at least one sacrificial pattern includes a plurality of sacrificial patterns between all adjacent ones of the boundary channels, respectively, the trench penetrating the plurality of sacrificial patterns, and each of the plurality of sacrificial patterns including the first and second portions.

4. The semiconductor device as claimed in claim 1, further comprising a boundary gate structure in contact with an uppermost one of the boundary channels and extending in the horizontal direction, the trench penetrating the boundary gate structure and extending in the horizontal direction along the boundary gate structure.

5. The semiconductor device as claimed in claim 4, further comprising spacers on opposite side surfaces of the boundary gate structure.

6. The semiconductor device as claimed in claim 1, further comprising an internal spacer between the at least one sacrificial pattern and each of the first and second source/drain structures.

7. The semiconductor device as claimed in claim 1, wherein the at least one sacrificial pattern includes silicon-germanium (SiGe).

8. The semiconductor device as claimed in claim 1, wherein:
the first source/drain structure is part of a first transistor, the first transistor further including first channels and a first gate structure surrounding the first channels, and
the second source/drain structure is part of a second transistor, the second transistor further including second channels and a second gate structure surrounding the second channels.

9. A semiconductor device, comprising:
a first source/drain structure;
a second source/drain structure;
first channels respectively extending from the first source/drain structure, the first channels being spaced apart from each other in a vertical direction;
second channels respectively extending from the second source/drain structure, the second channels being apart from each other in the vertical direction;
third channels respectively extending between the first source/drain structure and the second source/drain structure, the third channels being spaced apart from each other in the vertical direction;
a first gate structure surrounding the first channels, the first gate structure extending in a horizontal direction;
a second gate structure surrounding the second channels, the second gate structure extending in the horizontal direction;
at least one sacrificial pattern between adjacent ones of the third channels; and
a trench penetrating the at least one sacrificial pattern and the third channels, the trench extending in the horizontal direction,
wherein each of the third channels includes:
a first portion in contact with the first source/drain structure, the first portion having a first length in the horizontal direction, and
a second portion in contact with the second source/drain structure the second portion having a second length in the horizontal direction, the second length being less than the first length.

10. The semiconductor device as claimed in claim 9, wherein a first width in the horizontal direction of one of the first channels is greater than a second width in the horizontal direction of one of the second channels.

11. The semiconductor device as claimed in claim 9, wherein a number of the third channels equals a number of the first channels, and equals a number of the second channels.

12. The semiconductor device as claimed in claim 9, wherein a distance between adjacent ones of the third channels in the vertical direction equals a distance between adjacent ones of the first channels in the vertical direction, and equals a distance between adjacent ones of the second channels in the vertical direction.

13. The semiconductor device as claimed in claim 9, wherein a thickness of each of the third channels in the vertical direction equals a thickness of each of the first channels in the vertical direction, and equals a thickness of each of the second channels in the vertical direction.

14. The semiconductor device as claimed in claim 9, wherein the at least one sacrificial pattern includes:
a first portion in contact with the first source/drain structure, the first portion having a first length in the horizontal direction, and
a second portion in contact with the second source/drain structure, the second portion having a second length in the horizontal direction, the second length being less than the first length.

15. The semiconductor device as claimed in claim 9, wherein a volume of the first source/drain structure is greater than a volume of the second source/drain structure.

16. A semiconductor device, comprising:
a first transistor including:
first channels spaced apart from each other in a vertical direction,
a first gate structure surrounding the first channels, the first gate structure extending in a horizontal direction, and
a pair of first source/drain structures respectively on opposite sides of the first channels;
a second transistor including:
second channels spaced apart from each other in the vertical direction,
a second gate structure surrounding the second channels, the second gate structure extending in the horizontal direction, and
a pair of second source/drain structures respectively on opposite sides of the second channels; and
a boundary structure between the first transistor and the second transistor, the boundary structure including:
third channels spaced apart from each other in the vertical direction, and
sacrificial patterns respectively between the plurality of third channels, a length of those of the sacrificial patterns extending in the horizontal direction along sidewalls of the pair of first source/drain structures being different from a length of those of the sacrificial patterns extending in the horizontal direction along sidewalls of the pair of second source/drain structures.

17. The semiconductor device as claimed in claim 16, wherein the boundary structure further includes a trench penetrating the third channels and the sacrificial patterns.

18. The semiconductor device as claimed in claim 17, wherein the trench extends in the horizontal direction.

19. The semiconductor device as claimed in claim 16, wherein the third channels and the sacrificial patterns are in contact with one of the pair of first source/drain structures and with one of the pair of second source/drain structures.

* * * * *